United States Patent
Moradian et al.

(10) Patent No.: US 12,326,282 B2
(45) Date of Patent: Jun. 10, 2025

(54) COOLING FLOW IN SUBSTRATE PROCESSING ACCORDING TO PREDICTED COOLING PARAMETERS

(71) Applicant: APPLIED MATERIALS, INC., Santa Clara, CA (US)

(72) Inventors: Ala Moradian, San Jose, CA (US); Umesh Kelkar, Cupertino, CA (US); Orlando Trejo, Livermore, CA (US); Elizabeth Kathryn Neville, Redwood City, CA (US); Karthik Ramanathan, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 342 days.

(21) Appl. No.: 18/093,615

(22) Filed: Jan. 5, 2023

(65) Prior Publication Data
US 2024/0230189 A1 Jul. 11, 2024

(51) Int. Cl.
F25B 49/00 (2006.01)
F25B 41/40 (2021.01)

(52) U.S. Cl.
CPC .............. *F25B 49/00* (2013.01); *F25B 41/40* (2021.01); *F25B 2500/19* (2013.01); *F25B 2700/2105* (2013.01)

(58) Field of Classification Search
CPC ...... F25B 49/00; F25B 41/40; F25B 2500/19; H01J 37/32522; H01J 37/32926;
(Continued)

(56) References Cited

U.S. PATENT DOCUMENTS 12,106,948 B2 * 10/2024 Hirano .............. H01J 37/32935
2012/0048467 A1 3/2012 Mahadeswaraswamy et al.
(Continued)

FOREIGN PATENT DOCUMENTS

JP 2012073453 A 4/2012
KR 20170101185 A 9/2017
(Continued)

OTHER PUBLICATIONS

International Search Report and Written Opinion for International Application No. PCT/US2023/086083, mailed May 13, 2024, 11 Pages.

*Primary Examiner* — Kun Kai Ma
(74) *Attorney, Agent, or Firm* — LOWENSTEIN SANDLER LLP

(57) ABSTRACT

Technologies directed to cooling flow according to predicted cooling parameters for substrate processing are described. In some embodiments, a method includes receiving first data indicative of a process recipe for processing a substrate in a processing chamber of a substrate processing system. The method further includes inputting the first data into a model. The model includes a digital twin configured to represent thermal characteristics of the processing chamber. The method further includes receiving, via the model, a predicted value of a parameter associated with a flow of coolant through a cooling loop of the processing chamber. The method further includes causing coolant to flow through the cooling loop based on the predicted value of the parameter during execution of the process recipe in the processing chamber.

20 Claims, 8 Drawing Sheets

(58) Field of Classification Search
CPC .......... H01J 21/67248; H01J 21/67109; G05B 2219/45031; G05B 19/042
See application file for complete search history.

(56) References Cited

U.S. PATENT DOCUMENTS

| | | | |
|---|---|---|---|
| 2020/0043764 A1* | 2/2020 | Clark | H01L 22/12 |
| 2021/0375602 A1* | 12/2021 | Sasagawa | H01L 21/6831 |
| 2022/0092241 A1 | 3/2022 | Moradian et al. | |
| 2022/0284342 A1* | 9/2022 | Cantwell | G06F 18/2414 |
| 2023/0185268 A1* | 6/2023 | Moradian | G05B 19/188 |
| | | | 700/121 |

FOREIGN PATENT DOCUMENTS

| | | | | |
|---|---|---|---|---|
| KR | 20230055609 A | * | 4/2023 | |
| WO | WO-2020137802 A1 | * | 7/2020 | B24B 37/015 |
| WO | 2022155635 A1 | | 7/2022 | |

\* cited by examiner

COOLING FLOW IN SUBSTRATE PROCESSING ACCORDING TO PREDICTED COOLING PARAMETERS

TECHNICAL FIELD

The instant specification generally relates to the regulation of coolant flow in cooling loops of a processing chamber. More specifically, the instant specification relates to predicting values of cooling parameters based on process recipes and causing coolant to flow through the cooling loops based on the predicted values of the cooling parameters.

BACKGROUND

Substrate processing can utilize operations that output large amounts of heat that can damage component parts of processing chambers. The processing chambers include cooling loops for coolant flow to remove heat. By removing heat from the processing chambers, damage due to heat can be mitigated.

SUMMARY

The following is a simplified summary of the disclosure in order to provide a basic understanding of some aspects of the disclosure. This summary is not an extensive overview of the disclosure. It is not intended to delineate any scope of the particular implementations of the disclosure or any scope of the claims. Its sole purpose is to present some concepts of the disclosure in a simplified form as a prelude to the more detailed description that is presented later.

Technologies directed to cooling flow according to predicted cooling parameters for substrate processing are described. In some embodiments, a method includes receiving first data indicative of a process recipe for processing a substrate in a processing chamber of a substrate processing system. The method further includes inputting the first data into a model. The model includes a digital twin configured to represent thermal characteristics of the processing chamber. The method further includes receiving, via the model, a predicted value of a parameter associated with a flow of coolant through a cooling loop of the processing chamber. The method further includes causing coolant to flow through the cooling loop based on the predicted value of the parameter during execution of the process recipe in the processing chamber.

In some embodiments, a system includes a processing chamber configured to process a substrate. The processing chamber includes a cooling loop configured to flow coolant to cool at least a portion of the processing chamber. The system further includes a processing device coupled. The processing device is configured to receive first data indicative of a process recipe for processing the substrate in the processing chamber. The processing device is further configured to input the first data into a model. The model includes a digital twin configured to represent thermal characteristics of the processing chamber. The processing device is further to receive, via the model, a predicted value of a parameter associated with a flow of coolant through the cooling loop of the processing chamber. The processing device is further configured to cause coolant to flow through the cooling loop based on the predicted value of the parameter during execution of the process recipe in the processing chamber.

In some embodiments, a non-transitory machine-readable storage medium includes instructions that, when executed by a processing device, cause the processing device to: receive first data indicative of a process recipe for processing a substrate in a processing chamber of a substrate processing system. The processing device is further to input the first data into a trained machine learning model. The processing device is further to receive, via the trained machine learning model, a predicted value of a parameter associated with a flow of coolant through a cooling loop of the processing chamber. The processing device is further to cause coolant to flow through the cooling loop based on the predicted value of the parameter during execution of the process recipe in the processing chamber.

BRIEF DESCRIPTION OF THE DRAWINGS

Aspects and implementations of the present disclosure will be understood more fully from the detailed description given below and from the accompanying drawings, which are intended to illustrate aspects and implementations by way of example and not limitation.

DETAILED DESCRIPTION

Figure 1:
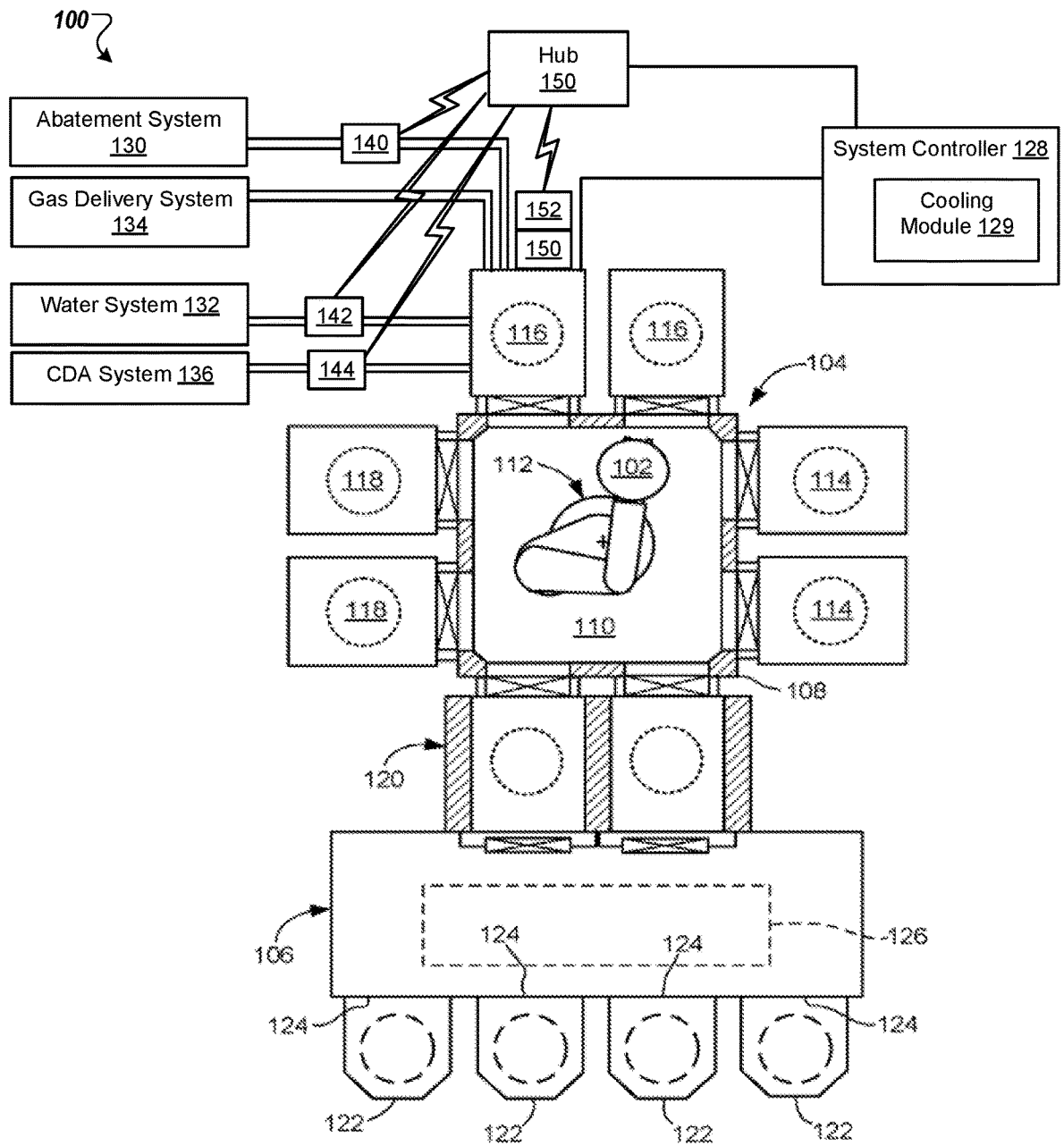
FIG. 1 is a top schematic view of an example manufacturing system, according to aspects of the present disclosure.

Embodiments of the present disclosure are directed to systems and methods for predicting cooling parameters of a substrate processing system and causing coolant to be flowed in the substrate processing system according to the predicted parameters. Substrate processing operations often generate heat that can damage manufacturing components such as component parts of processing chambers (e.g., seals, etc.). When certain components of a processing chamber reach a critical temperature, the component may fail entirely, leading to down time for repairs to take place or for replacement of the component.

Conventional substrate processing systems include cooling loops through which coolant may flow to remove heat energy from the system. Processing chambers can include multiple cooling loops that remove heat from different portions of the processing chamber. Coolant can often be water or an engineered coolant (e.g., engineered for enhanced cooling properties, etc.). A coolant pump may pump the coolant through the cooling loops and to a cooling tower where heat energy transferred from the processing chambers to the coolant is removed from the coolant. The coolant may then flow again through the cooling loops.

Conventionally, coolant flows through the cooling loops in an unregulated manner, meaning that coolant flows through the cooling loops at a predetermined constant flow rate. By flowing coolant at a constant flow rate, excess energy may be expended by the coolant pump in providing more coolant flow than needed. Additionally, by flowing the coolant at a constant flow rate, more heat may be removed from the system than is necessary, leading to more energy being expended to warm the processing chamber to a target temperature for processing. Flowing coolant at variable rates according to the cooling requirements of a process recipe operation may reduce the overall energy consumption of the system.

Aspects and implementations of the instant disclosure address the above-described and other shortcomings of conventional systems by causing coolant to be flowed through cooling loops based on predicted or estimated values of cooling parameters. In some embodiments, a processing chamber includes at least one cooling loop configured to flow coolant to cool at least a portion of the processing chamber. The cooling loop may include a valve configured to regulate the flow of coolant through the cooling loop. More coolant may flow through the cooling loop when the valve is opened and less coolant may flow when the valve is closed or partially closed. In some embodiments, an actuator is coupled to the valve to open and/or close the valve according to commands received by the actuator. The processing chamber may include multiple sensors, such as temperature sensors, flow rate sensors, etc. In some embodiments, the cooling loop includes a temperature sensor to sense an inlet temperature of coolant flowing at the inlet of the coolant loop, a temperature sensor to sense an outlet temperature of coolant flowing at the outlet of the coolant loop, and/or a flow rate sensor to sense a flow rate of coolant through the cooling loop.

In some embodiments, a processing device receives process recipe data corresponding to one or more process recipe operations that can be executed inside the processing chamber to process a substrate. The processing device may receive the process recipe data prior to performance of the process recipe in the processing chamber (e.g., during development of the process recipe, etc.). The process recipe data may include process 'knob' settings that are based on set points (e.g., temperature setpoints, pressure setpoints, radio frequency (RF) energy set point, etc.) for processing a substrate according to the process recipe. In some embodiments, the process recipe data is input into a model. The model may be made up of or include a digital twin that represents thermal characteristics of the processing chamber. In some examples, the digital twin is or includes a physics-based representation of the processing chamber to model heat transfer in the processing chamber (e.g., heat transfer through the shower head, pedestal, seals, chamber walls, cooling loops, etc.). In further examples, the digital twin is or includes a data-based representation of the processing chamber to model heat transfer in the processing chamber. In some embodiments, the process recipe data is input into a trained machine learning model.

In some embodiments, output data is received from the model. The output data may include a predicted or estimated value of one or more cooling parameter that will be achieved during execution of the recipe in a processing chamber. The predicted value(s) of the cooling parameter(s) may exceed target temperatures for one or more regions or components of the processing chamber. Accordingly, the predicted value of the cooling parameter may indicate that more cooling or less cooling is recommended for a particular process recipe operation. In some embodiments, the cooling parameter(s) include a coolant flow parameter and/or a coolant temperature parameter. For example, the predicted or estimated value of the cooling parameter may be a predicted/estimated coolant flow rate or a predicted/estimated coolant input temperature (e.g., a predicted temperature of coolant flowing into the cooling loop through the cooling loop inlet), or a combination thereof. The predicted/estimated coolant flow rate may be a recommended coolant flow rate that is an optimal coolant flow rate determined by the model.

In some embodiments, upon receiving the predicted/estimated value of the cooling parameter, the processing device adjusts one or more settings for a cooling parameter to be used during execution of the recipe by a processing chamber to cause coolant to flow through the cooling loop based on the predicted/estimated value of the cooling parameter. In some examples, the processing device causes a valve disposed along the flow path of the cooling loop to actuate to a particular position during execution of one or more stages of a recipe on a processing chamber. The valve may be actuated to open or close (e.g., partially open or partially close) which causes coolant to flow through the cooling loop substantially at the predicted/estimated flow rate indicated by the predicted/estimated value of the cooling parameter. In some examples, the processing device causes the inlet temperature of the coolant (e.g., the temperature of the coolant at the inlet of the cooling loop) to change to a predicted/estimated inlet temperature indicated by the predicted/estimated value of the cooling parameter. The processing device may cause the change in temperature by regulating the temperature of the cooling tower and/or by mixing a flow of cold coolant with a flow of warm coolant (e.g., cold and warm relative to each other). In some embodiments, the predicted/estimated value of the cooling parameter is stored in a memory coupled to the processing device for later use. For example, the predicted/estimated value may be attached to or included in a stored recipe. In some embodiments, coolant flow rate and/or coolant temperature may be associated with a recipe, and coolant flow rate and/or coolant temperature may be adjusted during execution of a recipe in accordance with the determined coolant flow rate and/or coolant temperature. Different coolant flow rates may be associated with different operations or steps of a recipe. Similarly, different coolant temperatures may be associated with different operations or steps of a recipe.

Embodiments of the present disclosure provide advantages over conventional systems described above. Particularly, some embodiments described herein can predict/estimate an optimal flow rate and/or temperature of coolant through one or more cooling loops of a substrate processing chamber. These predictions/estimations can be made prior to performance of the corresponding process recipe. Thus, coolant flow and/or temperature for cooling loops of a process chamber can be determined for a recipe during process recipe development. Causing the coolant to flow according to the predicted/estimated optimal flow rate and/or temperature during performance of the process recipe operations may conserve energy. Energy can be conserved by a coolant pump when flow rates are decreased. Further, energy used in substrate processing to increase temperature of the processing chamber and/or processing chamber components is not wastefully carried away by excess flows of coolant. Similarly, ideal or target temperatures of the processing chamber and/or the processing chamber components can be maintained by modulating the flow of coolant (e.g., flow rate and/or inlet flow temperature) which can lead to more accurate and/or efficient processing of substrates in the processing chamber. Additionally, the temperature of the processing chamber and/or the processing chamber components can be more quickly changed when the flow of coolant is modulated according to predicted/estimated cooling parameters that are based on a process recipe. Thus, the systems and methods of this disclosure can provide increased manufacturing system throughput.

FIG. 1 is a top schematic view of an example processing system 100 (also referred to herein as a manufacturing system), according to aspects of the present disclosure. In some embodiments, processing system 100 may be an electronics processing system configured to perform one or more processes on a substrate 102. In some embodiments, processing system 100 may be an electronics device manufacturing system. Substrate 102 can be any suitably rigid, fixed-dimension, planar article, such as, e.g., a silicon-containing disc or wafer, a patterned wafer, a glass plate, or the like, suitable for fabricating electronic devices or circuit components thereon. In some embodiments, processing system 100 is a semiconductor processing system. Alternatively, processing system 100 may be configured to process other types of devices, such as display devices.

Processing system 100 includes a process tool 104 (e.g., a mainframe) and a factory interface 106 coupled to process tool 104. Process tool 104 includes a housing 108 having a transfer chamber 110 therein. Transfer chamber 110 includes one or more processing chambers (also referred to as processing chambers) 114, 116, 118 disposed therearound and coupled thereto. Processing chambers 114, 116, 118 can be coupled to transfer chamber 110 through respective ports, such as slit valves or the like.

Processing chambers 114, 116, 118 can be adapted to carry out any number of processes on substrates 102. A same or different substrate process can take place in each processing chamber 114, 116, 118. Examples of substrate processes include atomic layer deposition (ALD), physical vapor deposition (PVD), chemical vapor deposition (CVD), etching, annealing, curing, pre-cleaning, metal or metal oxide removal, or the like. In one example, a PVD process is performed in one or both of processing chambers 114, an etching process is performed in one or both of processing chambers 116, and an annealing process is performed in one or both of processing chambers 118. Other processes can be carried out on substrates therein. Processing chambers 114, 116, 118 can each include a substrate support assembly. The substrate support assembly can be configured to hold a substrate in place while a substrate process is performed. Processing chamber 114, 116, 118 can each include one or more cooling loops through which coolant (e.g., water, etc.) may flow to cool the processing chamber.

Transfer chamber 110 also includes a transfer chamber robot 112. Transfer chamber robot 112 can include one or multiple arms, where each arm includes one or more end effectors at the end of the arm. The end effector can be configured to handle particular objects, such as wafers. In some embodiments, transfer chamber robot 112 is a selective compliance assembly robot arm (SCARA) robot, such as a 2 link SCARA robot, a 3 link SCARA robot, a 4 link SCARA robot, and so on.

A load lock 120 can also be coupled to housing 108 and transfer chamber 110. Load lock 120 can be configured to interface with, and be coupled to, transfer chamber 110 on one side and factory interface 106 on another side. Load lock 120 can have an environmentally-controlled atmosphere that is changed from a vacuum environment (where substrates are transferred to and from transfer chamber 110) to at or near an atmospheric-pressure inert-gas environment (where substrates are transferred to and from factory interface 106) in some embodiments. In some embodiments, load lock 120 is a stacked load lock having a pair of upper interior chambers and a pair of lower interior chambers that are located at different vertical levels (e.g., one above another). In some embodiments, the pair of upper interior chambers are configured to receive processed substrates from transfer chamber 110 for removal from process tool 104, while the pair of lower interior chambers are configured to receive substrates from factory interface 106 for processing in process tool 104. In some embodiments, load lock 120 are configured to perform a substrate process (e.g., an etch or a pre-clean) on one or more substrates 102 received therein.

Factory interface 106 can be any suitable enclosure, such as, e.g., an Equipment Front End Module (EFEM). Factory interface 106 can be configured to receive substrates 102 from substrate carriers 122 (e.g., Front Opening Unified Pods (FOUPs)) docked at various load ports 124 of factory interface 106. A factory interface robot 126 (shown dotted) can be configured to transfer substrates 102 between substrate carriers 122 (also referred to as containers) and load lock 120. In other and/or similar embodiments, factory interface 106 is configured to receive replacement parts from replacement parts storage containers 123. Factory interface robot 126 can include one or more robot arms and can be or include a SCARA robot. In some embodiments, factory interface robot 126 has more links and/or more degrees of freedom than transfer chamber robot 112. Factory interface robot 126 can include an end effector on an end of each robot arm. The end effector can be configured to pick up and handle specific objects, such as wafers. Alternatively, or additionally, the end effector can be configured to handle objects such as process kit rings.

Any conventional robot type can be used for factory interface robot 126. Transfers can be carried out in any order or direction. Factory interface 106 can be maintained in, e.g., a slightly positive-pressure non-reactive gas environment (using, e.g., nitrogen as the non-reactive gas) in some embodiments.

Processing system 100 can also include a system controller 128. System controller 128 can be and/or include a computing device such as a personal computer, a server computer, a programmable logic controller (PLC), a microcontroller, and so on. System controller 128 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 128 can include a data storage device (e.g., one or more disk drives and/or solid state drives), a main memory, a static memory, a network interface, and/or other components. System controller 128 can execute instructions to perform any one or more of the methodologies and/or embodiments described herein. The instructions can be stored on a computer readable storage medium, which can include the main memory, static memory, secondary storage and/or processing device (during execution of the instructions). In embodiments, execution of the instructions by system controller 128 causes system controller to perform the method of FIG. 7. System controller 128 can also be configured to permit entry and display of data, operating commands, and the like by a human operator.

In some embodiments, system controller 128 includes a cooling module 129, which may be a local server (e.g., hosted on a local server) that executes on the system controller 128 of the processing system 100. The cooling module 129 may be responsible for processing first sensor data generated by sensors of one or more processing chambers 114, 116, 118 as well as second sensor data from additional sensors 140, 142, 144 that are external to the processing chamber 114, 116, 118. The first sensor data may be generated by sensors that are integral to the processing chamber 114, 116, 118. Such sensors may include, for example, temperature sensors, power sensors, current sensors, pressure sensors, concentration sensors, and so on. The first sensor data output by the integral sensors of the processing chambers 114, 116, 118 may include measurements of current, voltage, power, flow (e.g., of one or more gases, CDA, water, etc.), pressure, concentration (e.g., of one or more gases), speed (e.g., of one or more moving parts, of gases, etc.), acceleration (e.g., of one or more moving parts, of gases, etc.), or temperature (e.g., of a substrate under process, of different locations in a processing chamber, and so on). In one embodiment, each chamber includes between about 20 to about 100 sensors. Although the cooling module 129 is described herein in association with processing system 100, in some embodiments, cooling module 129 is associated with multiple processing systems (e.g., one or more processing systems in a substrate processing facility).

In order to capture additional data not generally accessible by the integral sensors of the processing chambers 114, 116, 118, one or more external sensors 140, 142, 144, 152 may be attached to the processing chambers 114, 116, 118 and/or to feeds into and/or out of the processing chambers 114, 116, 118 and/or to sub-components that operate for the benefit of the processing chambers 114, 116, 118 (e.g., such as pumps and/or abatement systems). In one embodiment, each processing chamber includes about 3-6 external sensors attached to the processing chamber, sub-systems associated with the processing chamber, and/or inputs/outputs to and from the processing chamber. The second sensor data output by the external sensors 140, 142, 144, 152 may include, for example, current, flow, temperature, eddy current, concentration, vibration, voltage, or power factor. Examples of external sensors 140, 142, 144, 152 that may be used include clamp sensors that measure AC current or DC current (also referred to as a current clamp), clamp sensors that measure voltage, and clamp sensors that measure leakage current. Other examples of external sensors are vibration sensors, temperature sensors, ultrasonic sensors (e.g., ultrasonic flow sensors), accelerometers (i.e., acceleration sensors), etc.

In the example shown, an abatement system 130, a gas delivery system 134, a water system 132 and/or a CDA system 136 may provide environmental resources to the processing chambers 114, 116, 118 and/or to other components of the processing system 100 (e.g., to the transfer chamber, factory interface, load locks, etc.). In embodiments, the abatement system 130 performs abatement for residual gases, reactants and/or outputs associated with a process executed on a processing chamber 114, 116, 118. The abatement system 130 may burn residual gases and/or reactants, for example, to ensure that they do not pose an environmental risk. Additionally, in some embodiments, one or more pumps may be attached to and/or operate on behalf of one or more of the processing chambers 114, 116, 118. External sensors 140, 142, 144, 152 are shown with relation to a single processing chamber 116 as a simplification for the sake of clarity. However, it should be understood that similar external sensors may be attached on additional processing chambers and/or on lines to and/or from such additional processing chambers and/or to sub-systems associated with such additional processing chambers.

The external sensors 140, 142, 144, 152 may be IoT sensors in some embodiments. In some embodiments, the external sensors include a power source such as a battery. In some embodiments, the external sensors are wired sensors that are plugged into a power source such as an AC power outlet. In some embodiments, the external sensors do not include a power source, and instead receive sufficient power to operate based on environmental conditions. For example, a sensor that detects voltage, power and/or current may be wirelessly powered by such power or current (e.g., by harvesting energy from current that runs through a wire that a sensor is clamped over).

In one embodiment, the external sensors 140, 142, 144, 152 are sensors having embedded systems. An embedded system is a class of computing device that is embedded into another device as one component of the device. The external sensors 140, 142, 144, 152 typically also include other hardware, electrical and/or mechanical components that may interface with the embedded system. Embedded systems are typically configured to handle a particular task or set of tasks, for which the embedded systems may be optimized (e.g., generating and/or sending measurements). Accordingly, the embedded systems may have a minimal cost and size as compared to general computing devices.

The embedded systems may each include a communication module (not shown) that enables the embedded system (and thus the external sensor 140, 142, 144, 152) to connect to a LAN, to a hub 150, and/or or to a wireless carrier network (e.g., that is implemented using various data processing equipment, communication towers, etc.). The communication module may be configured to manage security, manage sessions, manage access control, manage communications with external devices, and so forth.

In one embodiment, the communication module of the external sensors 140, 142, 144, 152 is configured to communicate using Wi-Fi®. Alternatively, the communication module may be configured to communicate using Bluetooth®, Zigbee®, Internet Protocol version 6 over Low power Wireless Area Networks (6LowPAN), power line communication (PLC), Ethernet (e.g., 10 Megabyte (Mb), 100 Mb and/or 1 Gigabyte (Gb) Ethernet) or other communication protocols. If the communication module is configured to communicate with a wireless carrier network, then the communication module may communicate using Global Systems for Mobile Communications (GSM), Code-Division Multiple Access (CDMA), Universal Mobile Telecommunications Systems (UMTS), 3GPP Long Term Evaluation (LTE), Worldwide Interoperability for Microwave Access (WiMAX), or any other second generation wireless telephone technology (2G), third generation wireless telephone technology (3G), fourth generation wireless telephone technology (4G) or other wireless telephone technology.

In one embodiment, the communication module is configured to communicate with hub 150, which may be, for example, a Wi-Fi router or other type of router, switch or hub. The hub 150 may be configured to communicate with the communication module of each of the external sensors 140, 142, 144, 152, and to send measurements received from the external sensors 140, 142, 144, 152 to system controller 128. In one embodiment, hub 150 has a wired connection (e.g., an Ethernet connection, a parallel connection, a serial connection, Modbus connection, etc.) to the system controller 128, and sends the measurements to the system controller 128 over the wired connection. In one embodiment, the hub 150 is connected to one or more external sensors via a wired connection.

In some embodiments, hub 150 is connected to a network device that is connected to a local area network (LAN). The system controller 128 and the network device may each be connected to the LAN via a wireless connection, and through the LAN may be wirelessly connected to one another. External sensors 140, 142, 144, 152 may not support any of the communication types supported by the network device. For example, external sensor 140 may support Zigbee, and external sensor 142 may support Bluetooth. To enable such devices to connect to the LAN, the hub 150 may act as a gateway device connected to the network device (not shown) via one of the connection types supported by the network device (e.g., via Ethernet or Wi-Fi). The gateway device may additionally support other communication protocols such as Zigbee, PLC and/or Bluetooth, and may translate between supported communication protocols.

The system controller 128 may be connected to a wide area network (WAN). The WAN may be a private WAN (e.g., an intranet) or a public WAN such as the Internet, or may include a combination of a private and public network. In some embodiments, the system controller 128 may be connected to a LAN that may include a router and/or modem (e.g., a cable modem, a direct serial link (DSL) modem, a Worldwide Interoperability for Microwave Access (WiMAX®) modem, an long term evolution (LTE®) modem, etc.) that provides a connection to the WAN.

The WAN may include or connect to one or more server computing devices (not shown). The server computing devices may include physical machines and/or virtual machines hosted by physical machines. The physical machines may be rackmount servers, desktop computers, or other computing devices. In one embodiment, the server computing devices include virtual machines managed and provided by a cloud provider system. Each virtual machine offered by a cloud service provider may be hosted on a physical machine configured as part of a cloud. Such physical machines are often located in a data center. The cloud provider system and cloud may be provided as an infrastructure as a service (IaaS) layer. One example of such a cloud is Amazon's® Elastic Compute Cloud (EC2®).

The server computing device may host one or more services, which may be a web based service and/or a cloud service (e.g., a web based service hosted in a cloud computing platform). The service may maintain a session (e.g., via a continuous or intermittent connection) with the system controller 128 and/or system controllers of other manufacturing systems at a same location (e.g., in a fabrication facility or fab) and/or at different locations. Alternatively, the service may periodically establish sessions with the system controllers. Via a session with a system controller 128, the service may receive status updates from the cooling module 129 running on the system controller 128. The service may aggregate the data, and may provide a graphical user interface (GUI) that is accessible via any device (e.g., a mobile phone, tablet computer, laptop computer, desktop computer, etc.) connected to the WAN.

Cooling module 129 that executes on system controller 128 may process the first sensor data from the integral sensors of one or more processing chambers 114, 116, 118 and/or second sensor data from external sensors 140, 142, 144, 152 to determine coolant flow rates and/or coolant temperatures of coolant to be supplied to coolant loops of the processing chambers 114, 116, 118. Cooling module 129 may receive and/or process data associated with one or more process recipes including recipe operations for implementation in processing chambers 114, 116, 118. In some embodiments, cooling module 129 receives and/or processes process recipe data to determine predicted/estimated coolant flow rates and/or temperatures independent of the performance of the process recipe in one of processing chambers 114, 116, 118. In some embodiments, the cooling module 129 uses one or more models representing thermal characteristics of the processing chambers 114, 116, 118 to predict values of cooling parameters. In some embodiments, the cooling module 129 determines coolant flow and/or temperature based on process recipes having operations performed in the processing chambers using thermal models (e.g., models to predict thermal behavior) of the processing chambers, and/or sensor data collected by one or more sensors integral to and/or external to the processing chambers.

The cooling module 129 may utilize a physics-based model and/or a machine learning model (e.g., a data-based model) as described herein. In some embodiments, the cooling module 129 uses a digital twin (e.g., a digital representation) of a processing chamber to determine the amount of heat energy to be removed from the processing chamber during the execution of a substrate process operation. The digital twin may utilize principles and/or equations related to heat transfer, energy balance, and/or fluid dynamics to model behavior of a process chamber during performance of a process recipe. Where a digital twin cannot reliably predict/estimate heat energy to be removed, a machine learning model can be used by the cooling module 129. The machine learning model may be a physics-informed machine learning model that is informed by the digital twin. The cooling module 129 can predict and/or determine a value of a parameter associated with the flow of coolant through a cooling loop of the processing chamber based on the output of the model. For example, for a given type of coolant (e.g., water), the cooling module 129 can predict/estimate a flow rate of the coolant that is to be flowed through the cooling loop to remove the heat energy indicated by the output of the model. In another example, the cooling module 129 can predict/estimate an inlet temperature of the coolant supplied to the inlet of the cooling loop to remove the heat energy indicated by the output of the model. The cooling module 129 may cause coolant to flow into the cooling loop at the determined flow rate and/or at the determined inlet temperature to remove the predicted/estimated amount of heat from the processing chamber. In some embodiments, the cooling module 129 may cause an actuator (e.g., coupled to a valve) to actuate so that coolant flows through the cooling loop at the determined flow rate. Similarly, the cooling module 129 may cause change in temperature of a cooling tower to supply the coolant at the predicted/estimated temperature and/or may cause a cold flow of coolant to be combined with a warm flow of coolant to achieve the predicted/estimated temperature.

In some embodiments, the cooling module 129 may make predictions/estimations that incorporate user input. In some examples, a user (e.g., an engineer, a technician, etc.) can provide input to the cooling module 129 to influence adjustment of the cooling parameters. Specifically, the user input may indicate that cooling parameters are to be adjusted after each process recipe step and/or after the completion of all operations associated with a particular process recipe. In some examples, the cooling module 129 predicts/estimates cooling parameter values for each operation of the process recipe. The cooling module 129 may then cause change in coolant flow (e.g., via one or more flow controllers) for each operation of the process recipe. In some examples, the cooling module 129 predicts/estimates cooling parameter values for a first process recipe (e.g., collection of first process recipe operations) and for a second process recipe. The cooling module 129 may then cause change in coolant flow between performance of the first process recipe and performance of the second process recipe. In some embodiments, the user input may indicate that coolant flow is to be adjusted for process recipe operations that are longer than a threshold duration. Similarly, the user input may indicate that coolant flow is to be adjusted for process recipe operations related to deposition or etching, or not related to deposition or etching, etc. In some embodiments, the user input may indicate that the coolant flow is to be adjusted for different operational states of a processing chamber or manufacturing equipment. For example, the user input may indicate that the coolant flow is to be updated when the processing chamber (and/or manufacturing system) is in an idle state, a service state, and/or a substrate hand-off state. In some embodiments, the cooling module 129 predicts/estimates cooling parameter values for each instance the cooing flow is to be adjusted (e.g., based on the user input).

Figure 2:
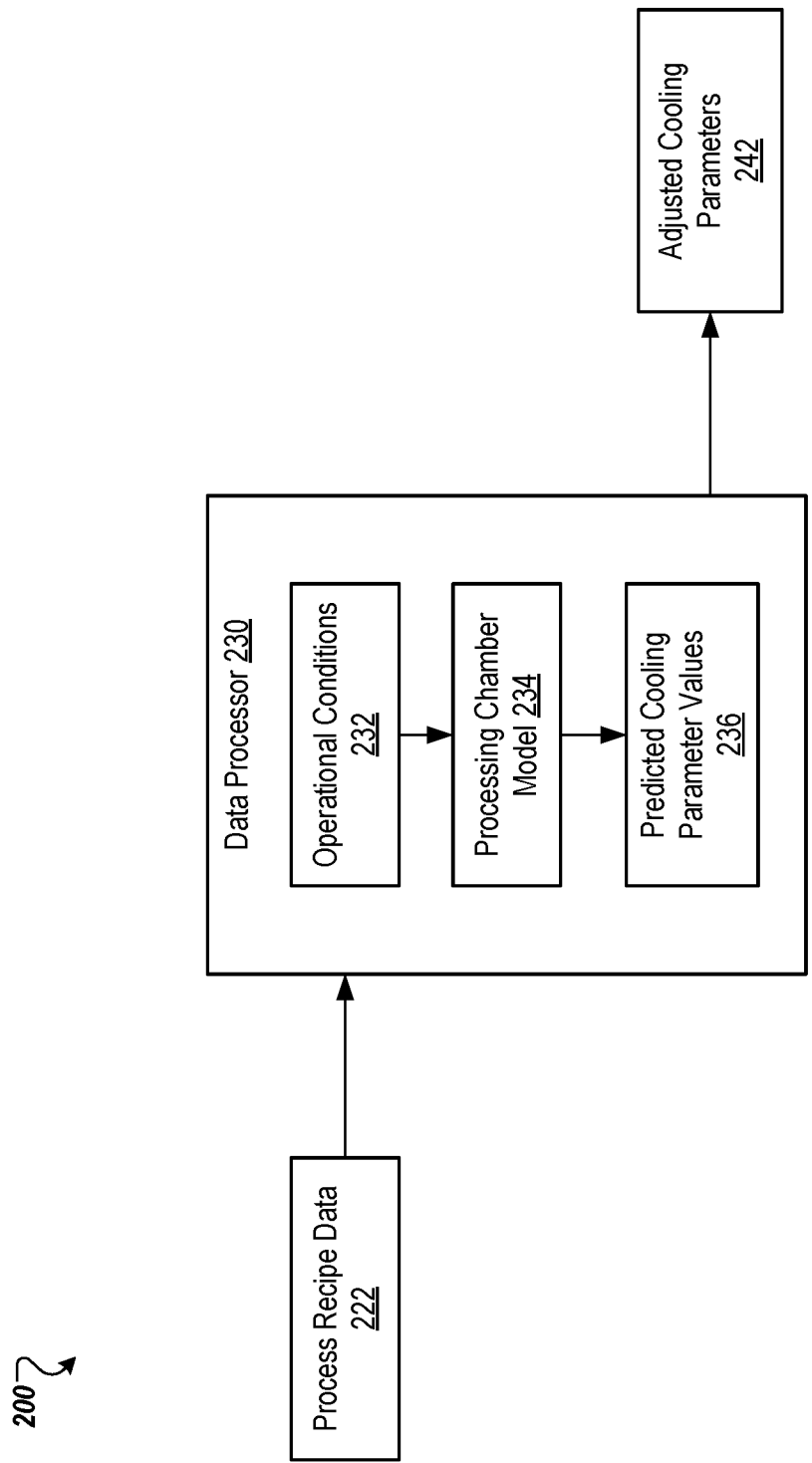
FIG. 2 is a block diagram illustrating a simplified flow diagram for a method of updating coolant flow, according to aspects of the present disclosure.

FIG. 2 is a block diagram illustrating a simplified flow diagram for a method 200 of updating coolant flow, according to aspects of the present disclosure. The method 200 may be performed by processing logic executed on a controller (e.g., cooling module 129 of FIG. 1) in some embodiments. In some embodiments, aspects of method 200 may be performed by one or more models, such as a physics-based model and/or a data-based model (e.g., a machine learning model).

In some embodiments, process recipe data 222 is provided to a data processor 230. Data processor 230 may be a processing device (e.g., a processing device of cooling module 129). Process recipe data 222 may include data corresponding to one or more process recipe operations. The process recipe operations can include operations related to substrate processing (e.g., etch operations, deposition operations, etc.), cleaning operations (e.g., chamber cleaning operations), service operations (e.g., leak checking operations, etc.), substrate hand-off operations (e.g., where a substrate is being placed in the processing chamber, where a substrate is being removed from the processing chamber, etc.), purge operations, pump-down operations, pre-preventive maintenance operations (e.g., operations in preparation for preventive maintenance), and/or post-preventive maintenance operations (e.g., operations in preparation for substrate processing after preventive maintenance). In some examples, process recipe data 222 may include recipe setpoint data, recipe threshold data, recipe target data, etc. In further examples, process recipe data 222 may indicate process variables such as pressure, temperature, etc. that one or more process operations are to be performed to process a substrate. In even further examples, process recipe data 222 may include flow rate data for process gas to be introduced into a processing chamber during a substrate processing operation. In yet another example, process recipe data 222 may include data indicative of RF frequency and/or RF energy specified by the recipe to process a substrate.

In some embodiments, operational conditions 232 of a processing chamber operating according to the process recipe (e.g., corresponding to process recipe data 222) are input into a processing chamber model 234. In some examples, one or more temperatures, pressures, energy inputs, etc. are input into a processing chamber model 234. The operational conditions 232 may include data that is reflective of the operational conditions collected over time during the performance of the process recipe operations. For example, the operational conditions 232 may include sensor data corresponding to sensed conditions (e.g., pressure, temperature, RF power, etc.) during execution of process recipe operations performed according to process recipes (e.g., corresponding to process recipe data 222). The operational conditions 232 may be input into the processing chamber model 234.

In some embodiments, the processing chamber model 234 is a physics-based and/or a data-based representation of the processing chamber. For example, the processing chamber model 234 may be a digital representation of the physical size, geometry, and/or characteristics of a processing chamber. Specifically, the processing chamber model 234 may digitally represent physical thermal characteristics of the processing chamber. For example, using a physics-based processing chamber model 234, finite element analysis can be performed to determine heat transfer through the processing chamber (e.g., from an energy source to the cooling loops). Similarly, the physics-based processing chamber model 234 may utilize heat transfer equations, energy balance equations, and/or fluid dynamics equations to model heat transfer through the processing chamber. Moreover, the processing chamber model may use methods such as finite difference, finite element, and/or finite volume to model heat transfer. Through such modeling of heat transfer, the processing chamber model 234 may be capable of predicting temperatures of various components of the processing chamber. For example, the processing chamber model 234 may be capable of predicting a showerhead temperature, a pedestal temperature, and/or wall temperature(s) using one or more of the modeling techniques described above. In some embodiments, the processing chamber model 234 may represent the processing chamber with data that maps input conditions to output conditions. The data may be collected over time during the operation of the processing chamber. In some embodiments, the processing chamber model 234 is a digital twin of the processing chamber and/or a trained machine learning model.

In some embodiments, the processing chamber model 234 outputs predicted/estimated cooling parameter values 236 corresponding to the operational conditions 232 input into the processing chamber model 234. The processing chamber model 234 may be used to determine heat transfer in the processing chamber based on the operational conditions 232 (e.g., via finite element analysis, etc. and/or by mapping input data to output data) and/or based on a process recipe. Based on heat transfer according to the processing chamber model 234, predicted/estimated cooling parameter values 236 may be output to a set of flow controllers for controlling the flow of coolant. The flow controllers may utilize the predicted/estimated cooling parameter values 236 to update the flow rate and/or temperature of coolant supplied to one or more cooling loops of a processing chamber. In some examples, the flow controllers are associated with a particular cooling loop, a particular processing chamber, and/or a manufacturing system having multiple processing chambers. In some examples, the predicted/estimated cooling parameter values 236 are predicted/estimated coolant flow rate values and/or predicted/estimated coolant input temperature values. In some embodiments, the data processor 230 outputs the predicted/estimated cooling parameter values 236. The predicted/estimated cooling parameters values 236 may be used to adjust and/or update cooling parameters to form adjusted cooling parameters 242.

Adjusted cooling parameters 242 may be determined for a process recipe that is to be performed in the processing chamber. In some examples, the adjusted cooling parameters 242 are determined during development of the process recipe. The adjusted cooling parameters 242 can be used during the first performance of a process recipe in a processing chamber. Different process recipes and/or different process recipe operations may have varying cooling requirements, so the predicted/estimated cooling parameter values 236 may vary between corresponding process recipes and/or process recipe operations. In some embodiments, flow of coolant through one or more cooling loops of the processing chamber is adjusted based on the predicted/estimated cooling parameter values and/or based on the adjusted cooling parameters 242. In some examples, flowing coolant through a cooling loop of the processing chamber according to a predicted flow rate value may sufficiently cool at least a portion of the processing chamber without unduly wasting energy (e.g., without unduly wasting energy input into the processing chamber and/or energy used to pump the coolant). In some examples, introducing coolant into the inlet of the cooling loop at a predicted coolant input temperature may sufficiently cool at least a portion of the processing chamber without unduly wasting energy. In some embodiments, flowing coolant through the cooling loop in accordance with the predicted cooling parameter value removes heat from the processing chamber such that the processing chamber can operate at the optimal temperature for the process recipe operation.

Figure 3:
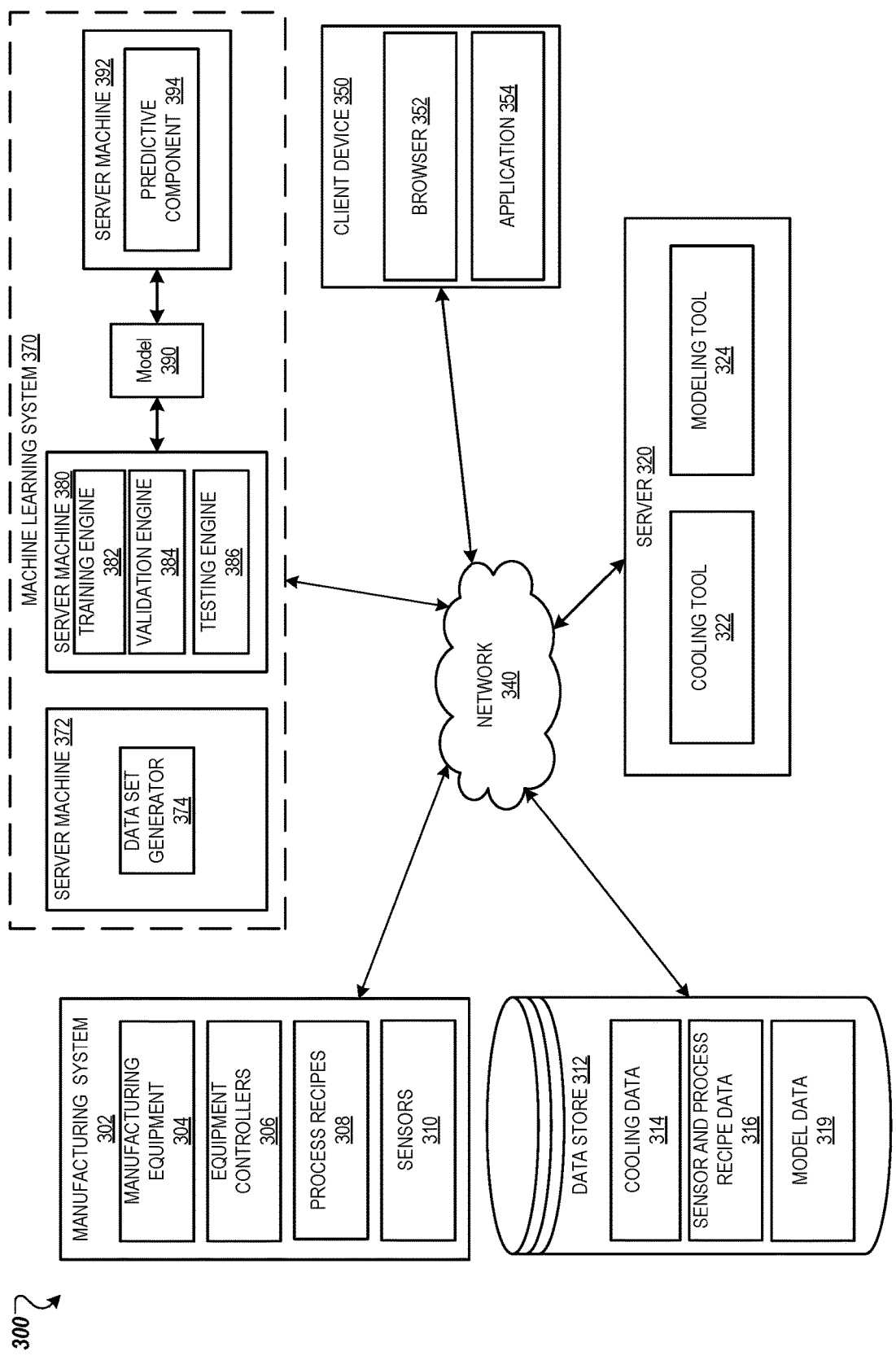
FIG. 3 is a block diagram illustrating an exemplary system architecture in which implementations of the disclosure may operate.

FIG. 3 is a block diagram illustrating an exemplary system architecture 300 in which implementations of the disclosure may operate. As shown in FIG. 3, system architecture 300 includes a manufacturing system 302, a data store 312, a server 320, a client device 350, and/or a machine learning system 370. The machine learning system 370 may be a part of the server 320. In some embodiments, one or more components of the machine learning system 370 may be fully or partially integrated into client device 350. The manufacturing system 302, the data store 312, the server 320, the client device 350, and the machine learning system 370 can each be hosted by one or more computing devices including server computers, desktop computers, laptop computers, tablet computers, notebook computers, personal digital assistants (PDAs), mobile communication devices, cell phones, hand-held computers, augmented reality (AR) displays and/or headsets, virtual reality (VR) displays and/or headsets, mixed reality (MR) displays and/or headsets, or similar computing devices. The server, as used herein, may refer to a server but may also include an edge computing device, an on premise server, a cloud, and the like.

The manufacturing system 302, the data store 312, the server 320, the client device 350, and the machine learning system 370 may be coupled to each other via a network (e.g., for performing methodology described herein). In some embodiments, network 360 is a private network that provides each element of system architecture 300 with access to each other and other privately available computing devices. Network 360 may include one or more wide area networks (WANs), local area networks (LANs), wires network (e.g., Ethernet network), wireless networks (e.g., an 802.11 network or a Wi-Fi network), cellular network (e.g., a Long Term Evolution (LTE) network), cloud network, cloud service, routers, hubs, switches server computers, and/or any combination thereof. Alternatively or additionally, any of the elements of the system architecture 300 can be integrated together or otherwise coupled without the use of the network 360.

The client device 350 may be or include any personal computers (PCs), laptops, mobile phones, tablet computers, netbook computers, network connected televisions ("smart TV"), network-connected media players (e.g., Blue-ray player), a set-top-box, over-the-top (OOT) streaming devices, operator boxes, etc. The client device 350 may include a browser 352, an application 354, and/or other tools as described and performed by other systems of the system architecture 300. In some embodiments, the client device 350 may be capable of accessing the manufacturing system 302, the data store 312, the server 320, and/or the machine learning system 370 and communicating (e.g., transmitting and/or receiving) data associated with cooling of manufacturing equipment 304 (e.g., processing chambers, etc.), and/or inputs and outputs of various process tools (e.g., cooling tool 322, modeling tool 324, and so on) at various stages of processing of the system architecture 300, as described herein.

As shown in FIG. 3, manufacturing system 302 includes manufacturing equipment 304, system controllers 306, process recipes 308, and sensors 310. The manufacturing equipment 304 may be any combination of an ion implanter, an etch reactor (e.g., a processing chamber), a photolithography devices, a deposition device (e.g., for performing chemical vapor deposition (CVD), physical vapor deposition (PVD), ion-assisted deposition (IAD), and so on), or any other combination of manufacturing devices. In some embodiments, components of manufacturing equipment 304 have a threshold component temperature. For example, above the threshold component temperature, individual components (such as seals in a processing chamber, etc.) may fail. Cooling the manufacturing equipment 304 so that component temperatures do not exceed their corresponding threshold component temperature may be provided by one or more (sometimes multiple) cooling loops in the manufacturing equipment 304. For example, a processing chamber can include multiple cooling loops through which coolant flows to remove heat from the processing chamber.

Process recipes 308, also referred to as fabrication recipes or fabrication process instructions, include an ordering of machine operations with process implementation that when applied in a designated order create a fabricated sample (e.g., a substrate or wafer having predetermined properties or meeting predetermined specifications). In some embodiments, the process recipes are stored in a data store or, alternatively or additionally, stored in a manner to generate a table of data indicative of the operations of the fabrication process. Each operation may be associated with known cooling data. Alternatively or additionally, each process operation may be associated with parameters indicative of physical conditions of a process operation (e.g., target pressure, temperature, exhaust, energy throughput, and the like).

Equipment controllers 306 may include software and/or hardware components capable of carrying out operations of process recipes 308. The equipment controllers 306 may monitor a manufacturing process through sensors 310. Sensors 310 may measure process parameters to determine whether process criteria are met. Process criteria may be associated with a process parameter value window. Sensors 310 may include a variety of sensors that can be used to measure (explicitly or as a measure of) consumptions (e.g., power, current, etc.). Sensors 310 could include physical sensors, integral sensors that are components of processing chambers, external sensors, Internet-of-Things (IOT) and/or virtual sensors (e.g., Sensors that are not physical sensors but based virtual measurements based on model that estimate parameter values), and so on.

In some embodiments, equipment controllers 306 may include a main memory (e.g., read-only memory (ROM), flash memory, dynamic random access memory (DRAM), static random access memory (SRAM), etc.), and/or secondary memory (e.g., a data store device such as a disk drive (e.g., data store 312 or cloud data). The main memory and/or secondary memory may store instructions for performing various types of manufacturing processes (e.g., process recipes 308).

In some embodiments, equipment controllers 306 may control flow of coolant to and/or from manufacturing equipment 304 based on predicted/estimated values of cooling parameters. For example, equipment controllers 306 may control the actuation of one or more actuators coupled to valves of manufacturing equipment 304 to regulate (e.g., modulate) the flow of coolant through one or more cooling loops of manufacturing equipment 304. In some embodiments, the actuators controllable by the equipment controllers 306 are configured to cause regulation of the coolant flow rate through cooling loops via the flow valves. In another example, equipment controller 306 may control the temperature of coolant supplied to the inlet of cooling loops of the manufacturing equipment 304. The equipment controller 306 may receive commands (e.g., via the network 340) from the cooling tool 322. In some embodiments, the equipment controllers 306 control the flow of coolant (e.g., flow rate, flow temperature, etc.) to optimize heat removal from the manufacturing equipment 304.

In some embodiments, the equipment controller 306 may control flow of coolant to manufacturing equipment 304 based on data collected from sensors 310 and/or based on a process recipe. For example, equipment controller 306 may cause more coolant to be flowed through a cooling loop based on temperature sensor data indicating an over-temperature condition in a processing chamber and/or based on a current temperature being satisfactory but an estimated or predicted future temperature being above a threshold temperature. In another example, equipment controller 306 may cause colder temperature coolant to be provided to the inlet of a cooling loop based on temperature sensor data indicating an over-temperature condition in a processing chamber and/or based on an estimated or predicted future temperature being above the threshold temperature. In some embodiments, the equipment controllers 306 may use data from sensors 310 to implement feedback control. For example, based on sensor and process recipe data 316, equipment controllers 306 may modulate the flow of coolant (e.g., flow rate and/or temperature) to meet a target value (e.g., a target value of a cooling parameter predicted by machine learning system 370 and/or by cooling tool 322).

Data store 312 may be a memory (e.g., a random access memory), a drive (e.g., a hard drive, a flash drive), a database system, or another type of component or device capable of storing data such as a store provided by a cloud server and/or processor. Data store 312 may store one or more historical sensor data. Data store 312 may store one or more cooling data 314 (e.g., including historical and/or current cooling data), sensor and process recipe data 316 (e.g., including historical and/or current sensor and process recipe data 316), and model data 319. The sensor and process recipe data 316 may include various process operations, process parameter windows, alternative process operations, process queuing instruction, and so on for performing multiple processes on overlapping manufacturing equipment. The sensor and process recipe data 316 may be linked or otherwise associated with the cooling data 314 to track cooling across various process operations, recipes, etc.

The cooling data 314 may include characterizations of manufacturing equipment cooling over time. For example, cooling data 314 may include coolant flow rate data and coolant temperature data (e.g., at inlets and/or outlets of cooling loops). Cooling data 314 may further include data indicative of heat transfer through cooling loops. Cooling data 314 may include historical data collected over time by sensors 310 and/or current sensor data associated with manufacturing equipment cooling.

The model data 319 may include data associated with a model of a physical asset (e.g., a model of a processing chamber). In some embodiments, the model data 319 includes data used to construct a physics-based model and/or data used to construct a data-based model (e.g., a machine learning model). The model data 319 may include data that replicates thermal characteristics of a physical asset such as a processing chamber. The model data 319 may be associated with a digital replica such as a digital twin. As used herein, a digital twin may include a digital replica of a physical asset, such as manufacturing equipment 304. The digital twin includes characteristics of the physical asset at each stage of the manufacturing process, in which the characteristics include, but are not limited to, coordinate axis dimensions, weight characteristics, material characteristics (e.g., density, surface roughness), electrical characteristics (e.g., conductivity), optical characteristics (e.g., reflectivity), thermal characteristics, etc.

As previously discussed, a digital replica may include a physics-based model of one or more physical assets of the substrate fabrication system. The model data 319 may encapsulate relationships, parameters, specifications, etc. associated with one or more aspects of the physics-based model. For example, the physics-based model may indicate a relationship between a size and a geometry of a substrate processing chamber and the heat transfer in the processing chamber. The physics-based model may indicate a relationship between a type of purge gas used within the substrate fabrication system and heat transfer. The predicted cooling parameter values may be associated with how heat transfer in the processing chamber is changed by modifying the type and quantity of gas used to purge a system. The physics-based model may indicate a relationship between at least one of a heat extraction procedure from the substrate fabrication system (e.g., cooling via one or more cooling loops) and the energy input into the system (e.g., in the form of heat and/or RF energy). The predicted cooling parameter values may be associated with a modification to at least one of a heat exhaust device, a gas abatement device, a water cooling device, or a gas vent structure. In some embodiments, the physics-based model may be a reduced order model (e.g., a reduced/simplified model of a full order model).

Server 320 may include a cooling tool 322 and/or a modeling tool 324. The various tools of server 320 may communicate data between each other to carry out each respective function, as described herein. The cooling tool 322 may determine adjustments to cooling parameters based on a predicted value of a cooling parameter. For example, the cooling tool 322 may determine an adjustment to a flow rate of coolant through a cooling loop of a processing chamber based on a predicted cooling parameter value (e.g., a predicted coolant flow rate value). In another example, the cooling tool 322 may determine an adjustment to an inlet temperature for coolant supplied to an inlet of a cooling loop of a processing chamber based on a predicted cooling parameter value (e.g., a predicted coolant input temperature). In some embodiments, the cooling tool 322 calculates a target flow rate of coolant to be flowed through a cooling loop based on a predicted amount of energy to be removed from a processing chamber via the cooling loop. Similarly, in some embodiments, the cooling tool 322 calculates a target coolant inlet temperature of coolant flowed into the inlet of the cooling loop. In some embodiments, the cooling tool determines one or more actuation values corresponding to the calculated and/or predicted flow rates. The cooling tool 322 may cause the flow of coolant to be modulated (e.g., via the equipment controller 306) based on the actuation values.

The modeling tool 324 receives model data 319 and/or manufacturing data from manufacturing system 302 and/or client device 350 and generates a model associated with the manufacturing data and/or the model data. The manufacturing data my include a selection of manufacturing equipment 304 and process operations to a process recipe 308. The modeling tool 324 generates a model of the physical system architecture of the manufacturing system or a virtual inputted system (e.g., generated by a user on the client device 350).

The model generated by the modeling tool 324 may include one of a physics model, a data model, a statistical model, a machine learning model, and/or a hybrid model. A physics model may include physics based constraints and control algorithms designed to estimate physical conditions (e.g., exhaust temperatures, power delivery requirements, coolant temperatures, coolant flow rates, and/or other conditions indicative of a physics environment associated with environmental resource consumption) of the inputted manufacturing data and/or model data 319. For example, a user may create a process recipe on client device 350. The process recipe may include parameters for a process or recipe and instructions to use machine equipment in a certain way. The modeling tool 324 would take this manufacturing data and determine physical constraints of the system (e.g., operating temperature, pressure, exhaust parameters, coolant temperatures and/or flow rates, etc.). For example, the physics model may identify physical conditions of a system based on the hardware configurations of chamber (e.g., using equipment material of type A versus equipment material of type B) and/or recipe parameters. In another example, physical conditions may be determined from relevant machine equipment parts that affect heat loss to water, air, and/or heating ventilation, and air conditioning (HVAC) equipment. The modeling tool 324 may work with other tools (e.g., cooling tool 322) to predict cooling parameters corresponding the received manufacturing data and/or model data 319. It should be noted that the modeling tool 324 may predict a cooling flow rate and/or coolant input temperature for a manufacturing process and selection of manufacturing equipment without receiving empirical data from performing the process recipe by the manufacturing equipment 304. Accordingly, models (e.g., digital replicas) of manufacturing equipment may be used to predict coolant flows for equipment designs and/or process recipes without actually building particular equipment designs or running particular process recipes.

In some embodiments, the modeling tool 324 may operate in association with a digital twin. As used herein, a digital twin is a digital replica of a physical asset, such as a manufactured part or a processing chamber. The digital twin includes characteristics of the physical asset at each stage of the manufacturing process, in which the characteristics include, but are not limited to, coordinate axis dimensions, weight characteristics, material characteristics (e.g., density, surface roughness), electrical characteristics (e.g., conductivity), optical characteristics (e.g., reflectivity), thermal characteristics, among other things.

In some embodiments, the physic-based models used by the modeling tool 324 may include fluid flow modeling, gas flow and/or consumption modeling, chemical based modeling, heat transfer modeling, cooling modeling, electrical energy consumption modeling, plasma modeling, and so on.

In some embodiments, the modeling tool 324 may employ statistical modeling to predict cooling parameters corresponding to manufacturing data. The predicted or estimated cooling parameters may include an amount of heat to remove from a process chamber, or region of a process chamber in embodiments. A statistical model may be used to process manufacturing data based on previously processed historical cooling data (e.g., cooling data 314) using statistical operations to validate, predict, and/or transform the manufacturing data. In some embodiments, the statistical model is generated using statistical process control (SPC) analysis to determine control limits for data and identify data as being more or less dependable based on those control limits. In some embodiments, the statistical model is associated with univariate and/or multivariate data analysis. For example, various parameters can be analyzed using the statistical model to determine patterns and correlations through statistical processes (e.g., range, minimum, maximum, quartiles, variance, standard deviation, and so on). In another example, relationships between multiple variables can be ascertained using regression analysis, path analysis, factor analysis, multivariate statistical process control (MCSPC) and/or multivariate analysis of variance (MANOVA).

In some embodiments, machine learning system 370 includes server machine 372, server machine 380, and/or server machine 392. Server machine 372 includes a data set generator 374 that is capable of generating data sets (e.g., a set of data inputs and a set of target outputs) to train, validate, and/or test a machine learning model 390.

Server machine 380 includes a training engine 382, a validation engine 384, and/or a testing engine 386. An engine (e.g., training engine 382, a validation engine 384, and/or a testing engine 386) may refer to hardware (e.g., circuitry, dedicated logic, programmable logic, microcode, processing device, etc.), software (such as instructions run on a processing device, a general purpose computer system, or a dedicated machine), firmware, microcode, or a combination thereof. The training engine 382 may be capable of training a machine learning model 390 using one or more sets of features associated with the training set from data set generator 374. The training engine 382 may generate one or multiple trained machine learning models 390, where each trained machine learning model 390 may be trained based on a distinct set of features of the training set and/or a distinct set of labels of the training set. For example, a first trained machine learning model may have been trained using resource consumption data output by the modeling tool 324, a second trained machine learning model may have been trained using historical cooling data (e.g., cooling data 314), and so on.

The validation engine 384 may be capable of validating a trained machine learning model 390 using the validation set from data set generator 374. The testing engine 386 may be capable of testing a trained machine learning model 390 using a testing set from data set generator 374.

The machine learning model(s) 390 may refer to the one or more trained machine learning models that are created by the training engine 382 using a training set that includes data inputs and, in some embodiments, corresponding target outputs (e.g., correct answers for respective training inputs). Patterns in the data sets can be found that cluster the data input and/or map the data input to the target output (the correct answer), and the machine learning model 390 is provided mappings and/or learns mappings that capture these patterns. The machine learning model(s) 390 may include artificial neural networks, deep neural networks, convolutional neural networks, recurrent neural networks (e.g., long short term memory (LSTM) networks, convLSTM networks, etc.), and/or other types of neural networks. The machine learning models 390 may additionally or alternatively include other types of machine learning models, such as those that use one or more of linear regression, Gaussian regression, random forests, support vector machines, and so on.

Predictive component 394 may provide current data to the trained machine learning model 390 and may run the trained machine learning model 390 on the input to obtain one or more outputs. The predictive component 394 may be capable of making determinations and/or performing operations from the output of the trained machine learning model 390. Machine learning (ML) model outputs may include confidence data that indicates a level of confidence that the ML model outputs (e.g., predicted cooling parameters such as amount of heat to be removed, coolant flow parameters, etc.) correspond to cooling parameters that when applied improve the cooling (e.g., via cooling loops) of a selection of a manufacturing process and/or manufacturing equipment. The predictive component 394 may perform process recipe modifications based on the ML model outputs in some embodiments, which may cause the amount of heat removed from a process chamber or region of a process chamber to be controlled to cause temperatures within the process chamber to be maintained within target temperature ranges. The predictive component 394 may provide the ML model outputs to one or more tools of the server 320.

The confidence data may include or indicate a level of confidence that the ML model output is correct (e.g., ML model output corresponds to a known label associated with a training data item). In one example, the level of confidence is a real number between 0 and 1 inclusive, where 0 indicates no confidence that the ML model output is correct and 1 indicates absolute confidence that the ML model output is correct. Responsive to the confidence data indicating a level of confidence below a threshold level for a predetermined number of instances (e.g., percentage of instances, frequency of instances, total number of instances, etc.) the server 320 may cause the trained machine learning model 390 to be re-trained.

For purpose of illustration, rather than limitation, aspects of the disclosure describe the training of a machine learning model using process recipe data and inputting a current selection of a manufacturing process and/or manufacturing equipment into the trained machine learning model to determine ML model output (process modification and optimization parameters such as a target eco-efficiency of a specific resource consumption). In other implementations, a heuristic model or rule-based model is used to determine an output (e.g., without using a trained machine learning model).

In some embodiments, the functions of manufacturing system 302, client device 350, machine learning system 370, data store 312, and/or server 320 may be provided by a fewer number of machines. For example, in some embodiments server machines 372 and 380 may be integrated into a single machine, while in some other embodiments, server machine 372, server machine 380, and server machine 392 may be integrated into a single machine. In some embodiments, server 320, manufacturing system 302, and client device 350 may be integrated into a single machine.

In general, functions described in one embodiment as being performed by manufacturing system 302, client device 350, and/or machine learning system 370 can also be performed on server 320 in other embodiments, if appropriate. In addition, the functionality attributed to a particular component can be performed by different or multiple components operating together. For example, in some embodiments, the server 320 may receive manufacturing data and perform machine learning operations. In another example, client device 350 may perform the manufacturing data processing based on output from the trained machine learning model.

In addition, the functions of a particular component can be performed by different or multiple components operating together. One or more of the server 320, manufacturing system 302, or machine learning system 370 may be accessed as a service provided to other systems or devices through appropriate application programming interfaces (API).

In embodiments, a "user" may be represented as a single individual. However, other embodiments of the disclosure encompass a "user" being an entity controlled by a plurality of users and/or an automated source. For example, a set of individual users federated as a group of administrators may be considered a "user."

Figure 4:
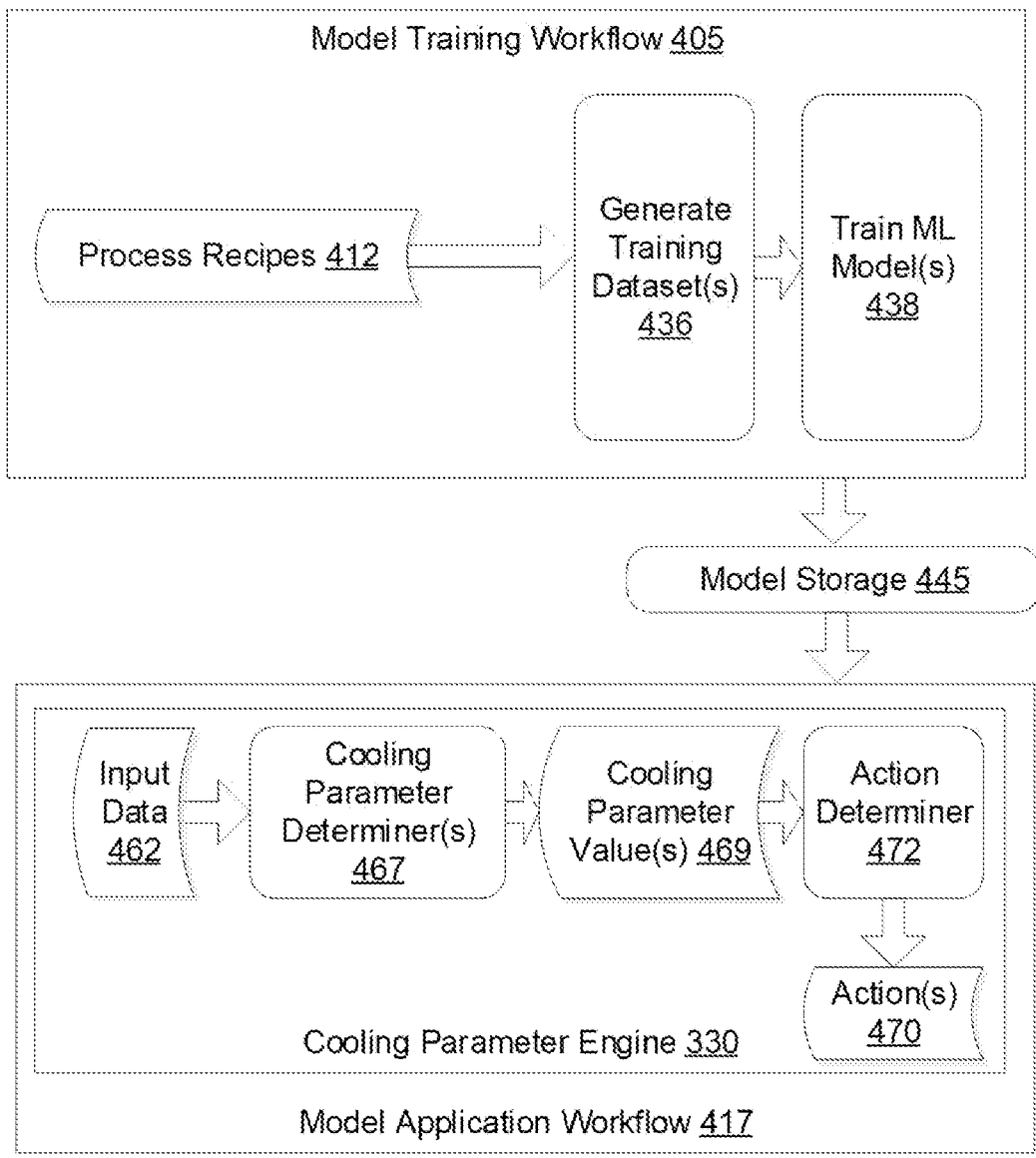
FIG. 4 illustrates a model training workflow and a model application workflow for cooling parameter value determination, according to aspects of the present disclosure.

FIG. 4 illustrates a model training workflow 405 and a model application workflow 417 for substrate placement determination according to aspects of the present disclosure. Model training workflow 405 and model application workflow 417 may be performed by processing logic executed by a processor of a computing device. One or more of these workflows 405, 417 may be implemented, for example, by one or more machine learning models implemented on a processing device and/or other software and/or firmware executing on a processing device.

The model training workflow 405 is to train one or more machine learning models (e.g., deep learning models) to determine cooling parameters values for flowing coolant through one or more cooling loops of a processing chamber. Model application workflow 417 is to apply the one or more trained machine learning models to perform cooling parameter assessment. Each of process recipes 412 may be associated with processing operations for processing a substrate. For example, each of process recipes 412 may reflect one or more process recipe setpoints (e.g., pressure setpoint, temperature setpoint, RF energy setpoint, etc.) corresponding to the process recipe. In some embodiments, process recipes 412 include substrate processing recipes, processing chamber cleaning recipes, processing chamber service recipes, substrate hand-off recipes, process chamber purge recipes, pre-preventive maintenance recipes, and/or post-preventive maintenance recipes.

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting.

In some embodiments, one or more machine learning models are trained to perform one or more cooling parameter value estimation tasks. In some embodiments, the one or more machine learning models are trained to estimate an amount of energy that one or more regions (e.g., parts or components) of a process chamber or other system will be exposed to, based on inputs such as current sensor values and/or a process recipe. Each task may be performed by a separate machine learning model. Alternatively, a single machine learning model may perform each of the tasks or a subset of the tasks. For example, a first machine learning model may be trained to determine a predicted/estimated amount of energy at one or more regions or components of a process chamber during execution of a process recipe (e.g., at one or more stages of execution of the process recipe). The first machine learning model may additionally or alternatively be trained to determine a predicted/estimated quantity of heat to be removed from the processing chamber via a cooling loop during the execution of a process operation according to a process recipe to maintain a temperature of the one or more components of the process chamber within a target temperature range. The first machine learning model and/or a second machine learning model may be trained to determine a parameter value (e.g., a predicted flow rate, a predicted coolant input temperature, etc.) that will cause the one or more components of the process chamber to maintain the temperature within the target temperature range. Additionally, or alternatively, different machine learning models may be trained to perform different combinations of the tasks. In an example, one or a few machine learning models may be trained, where the trained machine learning (ML) model is a single shared neural network that has multiple shared layers and multiple higher level distinct output layers, where each of the output layers outputs a different prediction, classification, identification, etc. For example, a first higher level output layer may determine a predicted quantity of heat and a second higher level output layer may determine a predicted coolant flow (flow and/or temperature). In some embodiments, accuracy of the machine learning model can be improved using one or more physics-based models. In some examples, where data does not exist for training (e.g., at conditions at the extremes of operation of a corresponding processing chamber), a physics model can be used to map inputs to outputs. The machine learning model can be further trained on the inputs and outputs of the physics-based model. By incorporating data from a physics-based model, the machine learning model may be a physics-informed machine learning model (PIML) or a physics-informed neural network (PINN).

One type of machine learning model that may be used to perform some or all of the above tasks is an artificial neural network, such as a deep neural network. Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and backpropagation to tune the weights of the network across all its layers and nodes such that the error is minimized. In many applications, repeating this process across the many labeled inputs in the training dataset yields a network that can produce correct output when presented with inputs that are different than the ones present in the training dataset.

For model training workflow 405, a training dataset containing hundreds, thousands, tens of thousands, hundreds of thousands or process recipes 412 should be used to form a training dataset. Data may include, for example, process recipe setpoints (e.g., control knob set points) each associated with a particular target temperature, coolant flow, heat removal, etc. This data may be processed to generate one or more training datasets 436 for the training of one or more machine learning models. Training data items in training datasets 436 may include process recipes 412, coolant flow data (e.g., coolant flow rate data, coolant temperature data, etc.), and/or sensor data collected during processing of substrates according to the process recipes.

To effectuate training, processing logic inputs the training dataset(s) 436 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above. Training may be performed by inputting input data such as one or more process recipes 412 (e.g., process recipe setpoints, etc.), images and/or age information of components into the machine learning one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences (e.g., estimations of cooling parameter values such as coolant flowrates and/or temperatures). Processing logic may compare the output estimated cooling parameter value(s) against historical parameter value(s). Processing logic determines an error (i.e., a classification error) based on the differences between the estimated parameter value(s) and the target parameter value(s). Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed recipes from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 40% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model. Once one or more trained machine learning models 438 are generated, they may be stored in model storage 445, and may be added to cooling parameter engine 330.

For model application workflow 417, according to one embodiment, input data 462 may be input into one or more cooling parameter determiners 467, each of which may include a trained neural network or other model. Additionally, or alternatively, one or more cooling parameter determiners 467 may apply finite element analysis algorithms to determine predicted heat transfer in a processing chamber. The input data may include a process recipe (e.g., process recipe setpoint data, process control knob data, etc.). The input data may additionally optionally include sensor data associated with coolant flow and/or component temperatures of a processing chamber executing the process recipe. Based on input data 462, cooling parameter determiner(s) 467 may output an estimated/predicted thermal state of one or more regions or components of a processing chamber or other system. The cooling parameter determiner(s) 467 may additionally or alternatively output an amount of thermal energy to remove from the one or more regions or components and/or one or more estimated cooling parameter value(s) 469. The estimated cooling parameter value(s) 469 may include a predicted coolant flow rate through a cooling loop and/or a predicted coolant input temperature for coolant introduced to the cooling loop at the inlet of the cooling loop that, when applied, will achieve the estimated thermal energy removal from the one or more regions and/or components of the process chamber.

An action determiner 472 may determine, based on the cooling parameter value(s) 469, one or more actions 470 to perform. In one embodiment, action determiner 472 compares the cooling parameter value estimations to one or more cooling parameter thresholds (e.g., coolant flow rate thresholds, coolant temperature thresholds, etc.). If one or more of the cooling parameter value estimations meets or exceeds a cooling parameter threshold, then action determiner 472 may determine that updating the cooling parameter (e.g., coolant flow through a cooling loop) for future substrate processing is recommended, and may output a recommendation or notification to update the cooling parameters. In some embodiments, action determiner 472 automatically updates cooling parameter metric(s) based on cooling parameter value(s) 469 meeting one or more criteria. In some examples, cooling parameter value(s) 469 may include an estimated flow rate of coolant through a processing chamber coolant loop, and/or an estimated coolant temperature of coolant introduced at the inlet of the cooling loop. In some embodiments, the action determiner 472 determines that a valve regulating the flow of coolant to a cooling loop is to be opened or closed (e.g., partially opened or partially closed) based on cooling parameters value(s) 469. For example, responsive to the cooling parameter value(s) indicating more heat is to be removed from the processing chamber, the action determiner 472 can determine that a coolant valve is to be (at least partially) opened. Similarly, the action determiner 472 can determine that coolant supplied to the cooling loops (e.g., from a cooling tower, from a chiller, etc.) is to have a lower temperature and the action determiner 472 can determine an action 470 to achieve such (e.g., provide more cold coolant to a coolant flow, decrease the temperature of the chiller, etc.).

Figure 5:
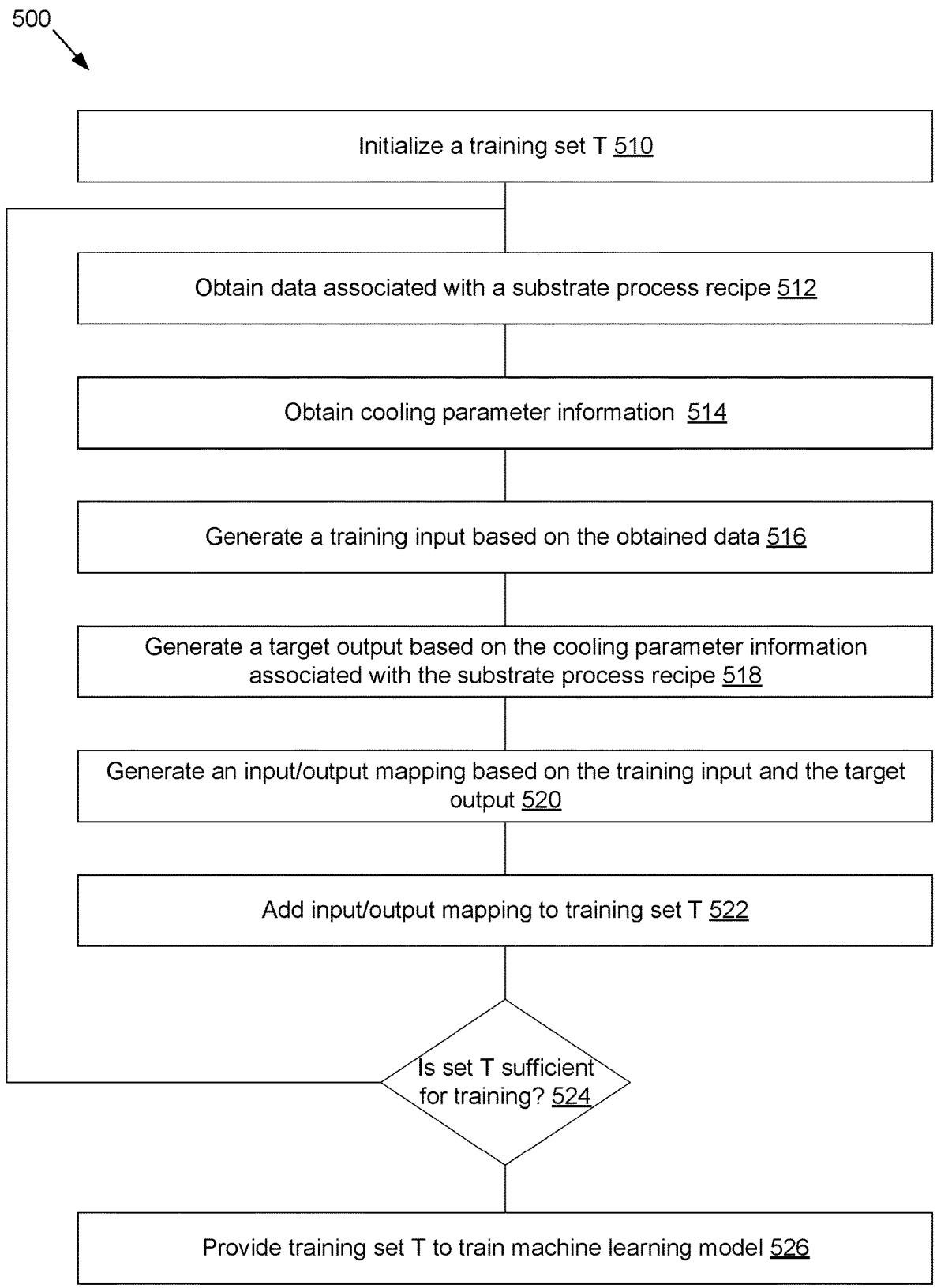
FIG. 5 is a flow chart of a method for generating a training dataset for training a machine learning model, according to aspects of the present disclosure.

FIG. 5 is a flow chart of a method 500 for generating a training dataset for training a machine learning model to perform cooling parameter assessments, according to aspects of the present disclosure. Method 500 is performed by processing logic that can include hardware (circuitry, dedicated logic, etc.), software (such as is run on a general purpose computer system or a dedicated machine), firmware, or some combination thereof. In one implementation, method 500 can be performed by a computer system, such as computer system architecture 300 of FIG. 3. In other or similar implementations, one or more operations of method 500 can be performed by one or more other machines not depicted in the figures. In some aspects, one or more operations of method 500 can be performed by training set generator 374 of machine learning system 370, described with respect to FIG. 3.

At block 510, processing logic initializes a training set T to an empty set (e.g., { }). At block 512, processing logic obtains substrate process recipe data (e.g., process recipe setpoint data, process knob setpoint data, process pressure setpoint data, process temperature setpoint data, etc.) associated with processing a substrate at a processing chamber of a manufacturing system. The process recipe data may include and/or make up historical process recipe data (e.g., recipe data collected over time). In some embodiments, processing logic further obtains sensor data (e.g., temperature sensor data, pressure sensor data, energy sensor data, etc.) associated with processing a substrate at a processing chamber in accordance with the process recipe. In some embodiments, processing logic further obtains threshold component temperature data corresponding to maximum threshold temperatures of processing chamber components, above which the components may fail.

At block 514, processing logic obtains cooling parameter information corresponding to the substrate process recipe. As described previously, the cooling parameter information may include information associated with a coolant flow through a cooling loop such as coolant flow rate and/or coolant temperature (e.g., at an inlet and/or outlet of the cooling loop). The cooling parameter information may include and/or make up historical parameter values (e.g., historical cooling parameter values).

At block 516, processing logic generates a training input based on the process recipe data and/or the sensor data obtained at block 512. In some embodiments, the training input can include a normalized set of recipe data.

At block 518, processing logic can generate a target output based on the cooling parameter information obtained at block 514. The target output can correspond to cooling parameter metrics (data indicative of coolant flow through cooling loops of the processing chamber) of a process recipe performed in the processing chamber.

At block 520, processing logic generates an input/output mapping. The input/output mapping refers to the training input that includes or is based on process recipe data, and the target output for the training input, where the target output identifies a value of a cooling parameter, and where the training input is associated with (or mapped to) the target output. At block 522, processing logic adds the input/output mapping to the training set T.

At block 524, processing logic determines whether the training set, T, includes a sufficient amount of training data to train a machine learning model. It should be noted that in some implementations, the sufficiency of training set T can be determined based simply on the number of input/output mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set, T, includes a sufficient amount of training data to train the machine learning model, processing logic provides the training set, T, to train the machine learning model. Responsive to determining the training set does not include a sufficient amount of training data to train the machine learning model, method 500 returns to block 512.

At block 526, processing logic provides the training set T to train the machine learning model. In some embodiments, the training set T is provided to training engine 382 of machine learning system 370 and/or server machine 392 to perform the training. In the case of a neural network, for example, input values of a given input/output mapping (e.g., recipe data and/or cooling parameter data) are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 526, machine learning model 390 can be used to provide predicted cooling parameter values for process recipe operations performed in the processing chamber.

Figure 6:
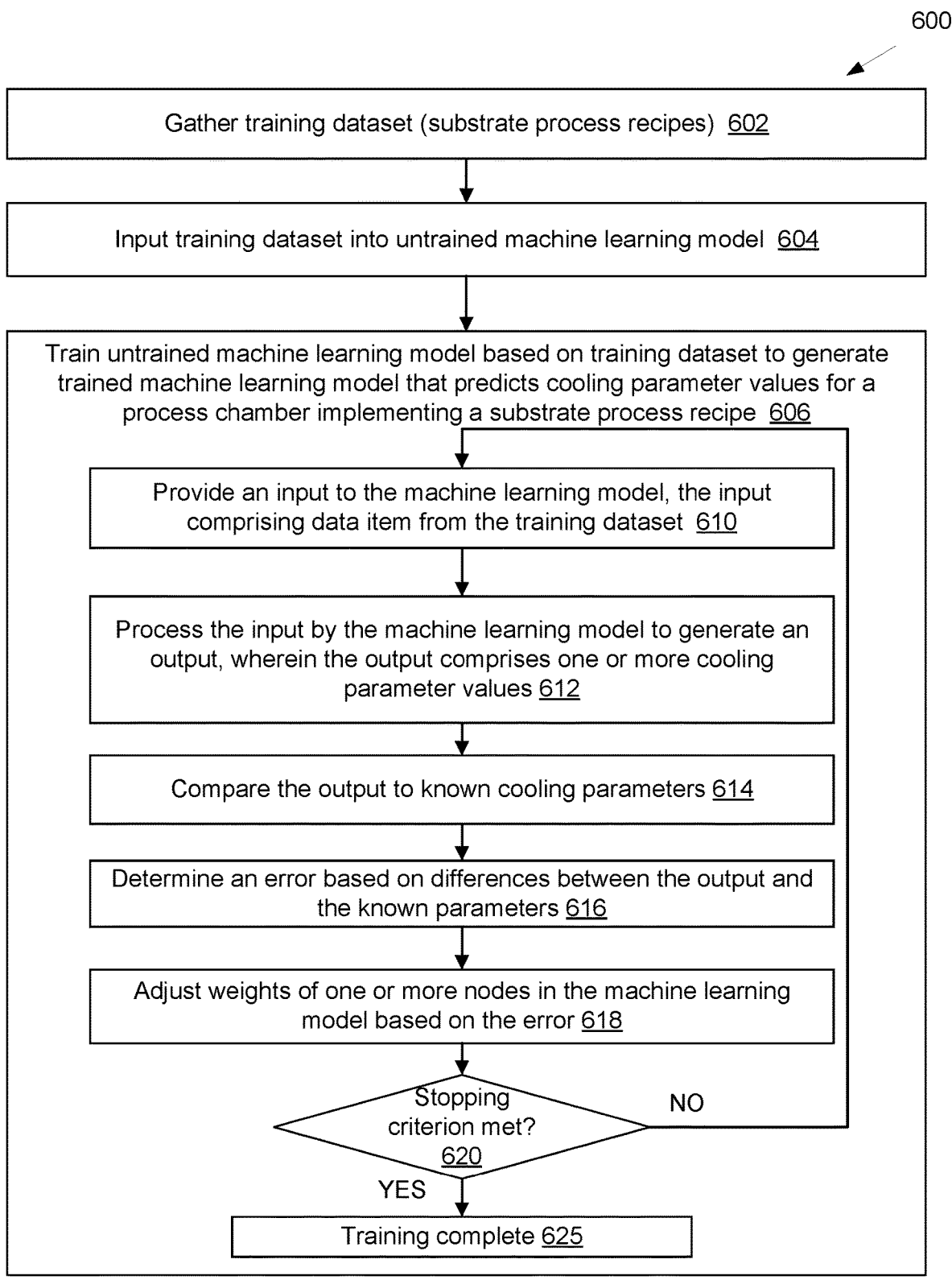
FIG. 6 illustrates a flow diagram for a method of training a machine learning model to determine a predicted cooling parameter value, in accordance with aspects of the present disclosure.

FIG. 6 is a flow chart illustrating an embodiment for a method 600 of training a machine learning model to estimate cooling parameter values for process recipes performed in a processing chamber, according to aspects of the present disclosure. Method 600 is performed by processing logic that can include hardware (circuitry, dedicated logic, etc.), software (such as is run on a general purpose computer system or a dedicated machine), firmware, or some combination thereof. In one implementation, method 600 can be performed by a computer system, such as computer system architecture 300 of FIG. 3. In other or similar implementations, one or more operations of method 600 can be performed by one or more other machines not depicted in the figures. In some aspects, one or more operations of method 600 can be performed by training engine 382 of machine learning system 370, described with respect to FIG. 3.

At block 602 of method 600, processing logic gathers a training dataset, which may include data from a plurality of substrate process recipes (e.g., process recipe setpoints, process control knob setpoints, etc.). The training dataset may further include sensor data associated with the performance of substrate process recipes. Each data item of the training dataset may include one or more labels. The data items in the training dataset may include input-level labels that indicate a cooling parameter value associated with the substrate process recipe. For example, some data items may include a label of a coolant flow rate through a processing chamber cooling loop associated with the process recipe. In another example, data items may include a label of heat generated by the process recipe.

At block 604, data items from the training dataset are input into the untrained machine learning model. At block 606, the machine learning model is trained based on the training dataset to generate a trained machine learning model that classifies or estimates one or more cooling parameters for processing a substrate in a processing chamber according to the process recipe. The machine learning model may also be trained to output one or more other types of predictions, classifications, decisions, and so on.

In one embodiment, at block 610 an input of a training data item is input into the machine learning model. The input may include substrate process recipe data (e.g., a substrate process recipe) indicating one or more process recipe setpoints. The data may be input as a feature vector in some embodiments. At block 612, the machine learning model processes the input to generate an output. The output may include one or more cooling parameter values (e.g., coolant flow rates, coolant temperatures, etc.). The cooling parameter values may be recommended cooling parameter values (such as coolant flow rates and/or inlet temperatures) for processing a substrate according to a process recipe. The output may additionally or alternatively include predicted quantities of heat generated when the process recipe is executed. For example, a predicted quantity of heat may be indicative of an excess amount of heat that is to be removed from the processing chamber during execution of a process recipe operation to prevent heat damage to the processing chamber and/or components. A target coolant flow rate and/or target coolant inlet temperature at a cooling loop of the processing chamber can be determined based on the quantity of heat to be removed.

At block 614, processing logic compares the output probabilities and/or values of cooling parameter metrics to known optimal cooling parameter values associated with the input. At block 616, processing logic determines an error based on differences between the output and the known cooling parameter values. At block 618, processing logic adjusts weights of one or more nodes in the machine learning model based on the error.

At block 620, processing logic determines if a stopping criterion is met. If a stopping criterion has not been met, the method returns to block 610, and another training data item is input into the machine learning model. If a stopping criterion is met, the method proceeds to block 625, and training of the machine learning model is complete.

In one embodiment, one or more ML models are trained for application across multiple processing chambers, which may be a same type or model of processing chamber. A trained ML model may then be further tuned for use for a particular instance of a processing chamber. The further tuning may be performed by using additional training data items comprising substrate process recipes that can be performed in the processing chamber in question. Such tuning may account for chamber mismatch between chambers and/or specific hardware process kits of some processing chambers. Additionally, in some embodiments, further training is performed to tune an ML model for a processing chamber after maintenance on the processing chamber and/or one more changes to hardware of the processing chamber.

Figure 7:
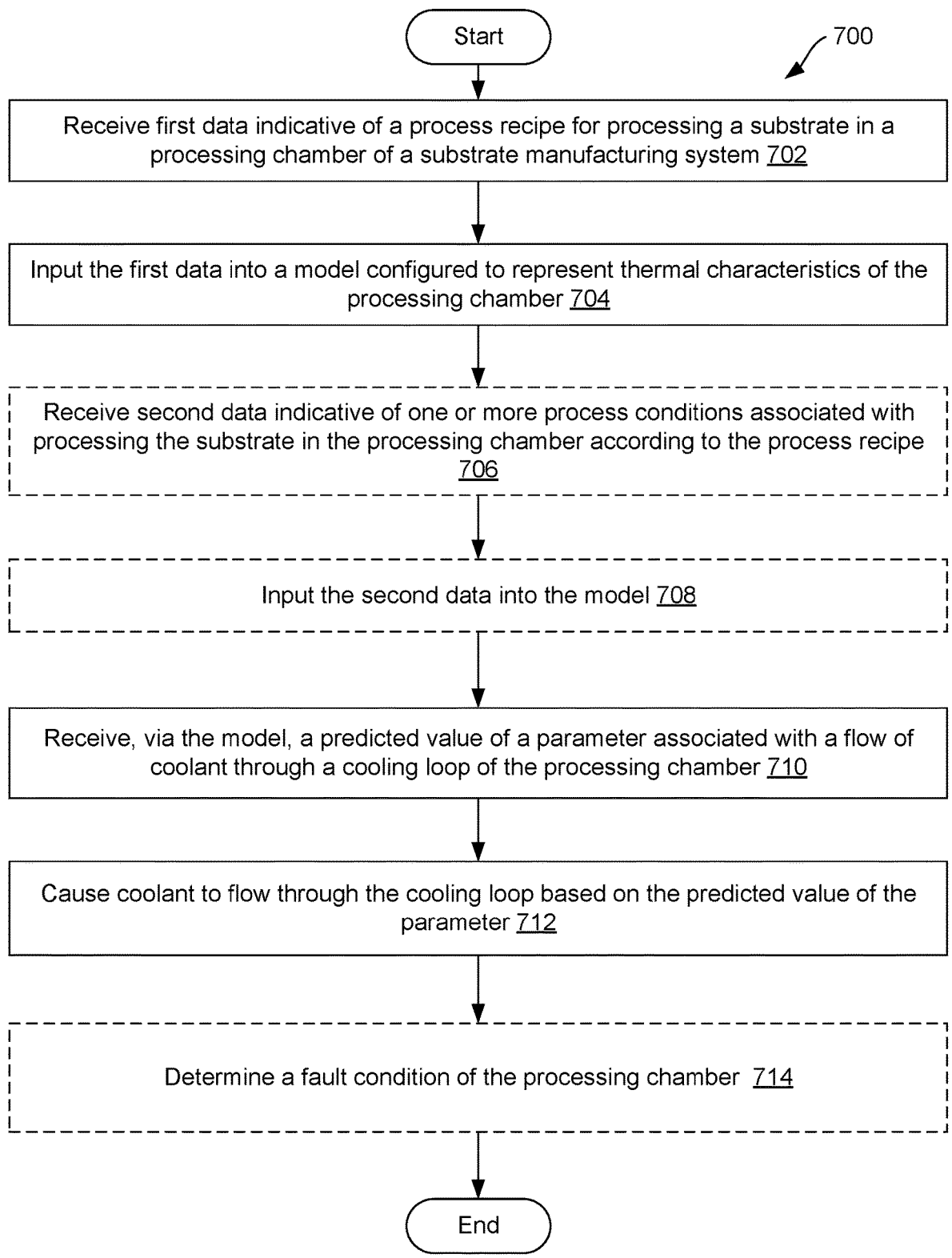
FIG. 7 is a flow diagram for a method of determining a predicted value of a cooling parameter, according to aspects of the present disclosure.

FIG. 7 is a flow diagram for a method 700 of determining a predicted value of a cooling parameter, according to aspects of the present disclosure. Method 700 is performed by processing logic that can include hardware (circuitry, dedicated logic, etc.), software (such as is run on a general purpose computer system or a dedicated machine), firmware, or some combination thereof. In one implementation, method 700 can be performed by a computer system, such as computer system architecture 300 of FIG. 3. In other or similar implementations, one or more operations of method 700 can be performed by one or more other machines not depicted in the figures. In some aspects, one or more operations of method 700 can be performed by cooling tool 322 of server 320, described with respect to FIG. 3.

For simplicity of explanation, method 700 is depicted and described as a series of operations. However, operations in accordance with this disclosure can occur in various orders and/or concurrently and with other operations not presented and described herein. Furthermore, not all illustrated operations may be performed to implement method 700 in accordance with the disclosed subject matter. In addition, those skilled in the art will understand and appreciate that method 700 could alternatively be represented as a series of interrelated states via a state diagram or events.

At block 702, processing logic (e.g., of a processing device) receives first data indicative of a process recipe for processing a substrate in a processing chamber of a substrate processing system. The first data may include process recipe setpoint data, process recipe control knob data, process recipe target temperature data, and/or the like. For example, the first data can include a process knob setting, a process temperature setting, and/or a process pressure setting for processing the substrate inside the processing chamber.

At block 704, processing logic inputs the first data into a model configured to represent thermal characteristics of the processing chamber. In some examples, the processing logic inputs the first data into a physics-based model, a data-based model, and/or a hybrid model. In some embodiments, the model is a trained machine learning model as described herein. In some examples, the model is trained with training input data that includes historical process recipe data, historical process condition data, and/or historical threshold chamber component temperature data. The trained machine learning model is further trained with training target output data including historical parameter values. In some embodiments, the training input data is labeled with corresponding target output data (e.g., labeled with corresponding training output data). In some embodiments, the trained machine learning model is supplemented with a physics-based model. In some examples, for fringe conditions (e.g., conditions at which little historical data has been collected such as at extreme operating conditions, etc.), the model may use physics-based modeling while for central conditions (e.g., conditions at which large quantities of historical data have been collected), the model may use machine learning to model behavior. The model may represent heat transfer characteristics of the processing chamber based on input energy and/or coolant flowing through cooling loops of the processing chamber. In some embodiments, the model can represent thermal characteristics based on finite element analysis of a physics-based model of the processing chamber.

At block 706, processing logic optionally receives second data indicative of one or more process conditions associated with processing the substrate in the processing chamber according to the process recipe. For example, the processing device may receive sensor data from sensors of the processing chamber during or after execution of a process in the processing chamber. The sensor data may include temperature data, pressure data, energy data (e.g., RF energy data), and/or the like. In some examples, the sensor data includes input coolant temperature measured by a temperature sensor at the inlet of a cooling loop and/or outlet coolant temperature measured by a temperature sensor at the outlet of the cooling loop. The sensor data may include data indicative of a delta (e.g., difference) between the cooling loop inlet temperature and the cooling loop outlet temperature. In some embodiments, the second data further includes threshold component temperature data (e.g., maximum allowable component temperatures). For example, the second data may include temperature data indicative of a maximum temperature a component of the processing chamber can withstand before failure. The second data is input into the model at block 708.

In some embodiments, processing logic further receives user input associated with the cooling parameter. In some examples, a user can make an input indicative of a target coolant flow rate and/or a desired coolant temperature. In some examples, a user can input a default temperature of the coolant supplied to the cooling loop, and/or the user can input a default coolant flow rate supplied to the cooling loop. In some embodiments, the processing logic receives user input indicative of ranges according to which the coolant may flow (e.g., the coolant flowing through the cooling loop may flow within a user-specified flow rate range and/or within a user-specified temperature range, etc.). In some embodiments, the user input may include indications of how often the cooling parameters are to be updated with new predicted values. For example, user input may indicate that the cooling parameters are to be updated with new predicted cooling parameter values after each process recipe operation or only after the whole process recipe has been performed, etc. Data indicative of the user input may be input into the model.

At block 710, processing logic receives, via the model, a predicted value of a parameter associated with a flow of coolant through a cooling loop of the processing chamber. In some embodiments, the predicted value of the parameter is a predicted flow rate value or a predicted inlet coolant temperature value. In some embodiments, the predicted value of the parameter is a recommended flow rate value or a recommended inlet coolant temperature value for cooling one or more components of the processing chamber. In some embodiments, the predicted value of the parameter is a predicted temperature of one or more components of the processing chamber and/or a predicted amount of heat in the processing chamber. In some embodiments, the processing logic receives predicted values of parameters each associated with a different cooling loop of the processing chamber. In some embodiments, the processing logic receives, via the model, predicted chamber conditions (e.g., predicted temperature, predicted pressure, etc.) associated with the performance of the process recipe operations. The predicted value may be based on one or more estimated/predicted temperatures of one or more components and/or regions of the processing chamber, and/or an estimated/predicted amount of heat energy to be removed from the processing chamber during performance of one or more process recipe operations.

In some embodiments, based on the predicted value of the parameter, the processing logic determines one or more target coolant temperatures. In some examples, the processing logic can determine a target coolant output temperature corresponding to the temperature of coolant output from a cooling loop of the processing chamber (e.g., the coolant output from the cooling loop having removed heat from the processing chamber while flowing along a flow path of the cooling loop). The target coolant output temperature may be determined using thermodynamic properties of the coolant. For example, based on heat capacity of the coolant, the inlet temperature of the coolant, and/or predicted heat to be extracted from the processing chamber via the cooling loop, the processing logic can determine a target coolant output temperature corresponding to the temperature of the coolant output from the cooling loop.

At block 712, during execution of the process recipe in the processing chamber, processing logic causes coolant to flow through the cooling loop based on the predicted value of the parameter. In some embodiments, processing logic causes actuation of an actuator coupled to a flow control valve that regulates the flow of coolant through the cooling loop. In some examples, the actuator is caused to open or close the valve to cause coolant to flow through the cooling loop at the predicted flow rate. In some embodiments, processing logic causes coolant to flow into the cooling loop (e.g., via the inlet of the cooling loop) at the predicted coolant temperature. In some examples, a warm flow of coolant and a cold flow of coolant (e.g., warm and cold relative to each other) are caused to be combined at determined ratios to flow coolant into the cooling loop at the predicted temperature. In some embodiments, coolant is caused to flow through the cooling loop to maintain the coolant output temperature at a target coolant output temperature that may be determined at block 710.

At block 714, processing logic optionally determines a fault condition of the processing chamber. The fault condition may be degradation of the processing chamber (e.g., processing chamber components) and/or clogging in the cooling loop, etc. In some embodiments, the fault condition is determined based on predicted conditions output from the model. The fault condition may be determined further based on the second data received at block 706. In some embodiments, the fault condition corresponds to a mismatch of sensor data received during the processing of a substrate according to the process recipe and the predicted conditions output from the model. In some embodiments, a notification of the fault condition is prepared for display on a GUI. Similarly, a corrective action (e.g., such as stopping the process recipe operation) may be performed responsive to the determination of the fault condition.

Figure 8:
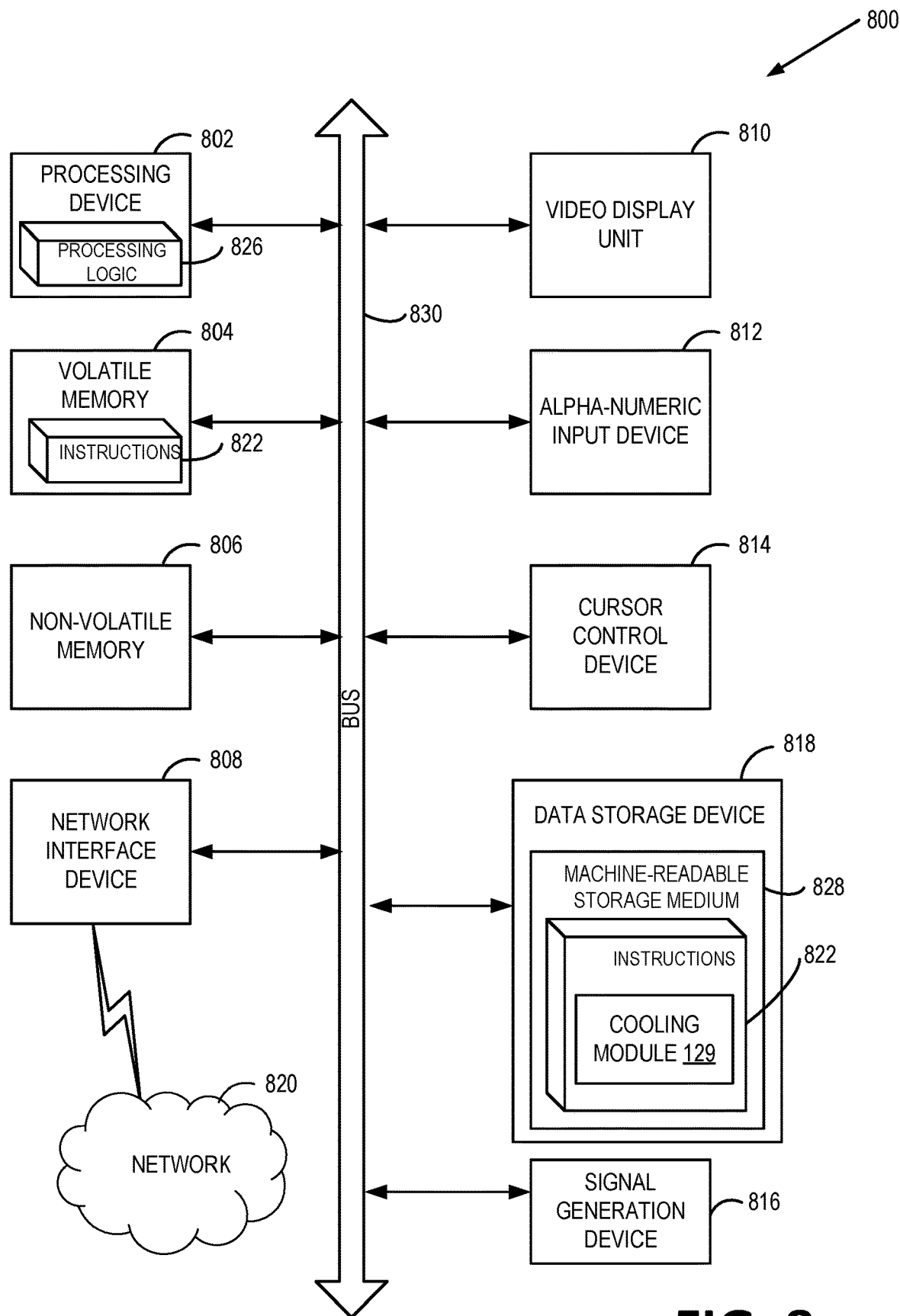
FIG. 8 depicts a block diagram of an example computing device, operating in accordance with one or more aspects of the present disclosure.

FIG. 8 depicts a block diagram of an example computing device, operating in accordance with one or more aspects of the present disclosure. In various illustrative examples, various components of the computing device 800 may represent various components of the system controller 128, cooling tool 322, client device 350, and so on.

Example computing device 800 may be connected to other computer devices in a LAN, an intranet, an extranet, and/or the Internet (e.g., using a cloud environment, cloud technology, and/or edge computing). Computing device 800 may operate in the capacity of a server in a client-server network environment. Computing device 800 may be a personal computer (PC), a set-top box (STB), a server, a network router, switch or bridge, or any device capable of executing a set of instructions (sequential or otherwise) that specify actions to be taken by that device. Further, while only a single example computing device is illustrated, the term "computer" shall also be taken to include any collection of computers that individually or jointly execute a set (or multiple sets) of instructions to perform any one or more of the methods discussed herein.

Example computing device 800 may include a processing device 802 (also referred to as a processor or CPU), a main memory 804 (e.g., read-only memory (ROM), flash memory, dynamic random access memory (DRAM) such as synchronous DRAM (SDRAM), etc.), a static memory 806 (e.g., flash memory, static random access memory (SRAM), etc.), and a secondary memory (e.g., a data storage device 818), which may communicate with each other via a bus 830.

Processing device 802 represents one or more general-purpose processing devices such as a microprocessor, central processing unit, or the like. More particularly, processing device 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. In accordance with one or more aspects of the present disclosure, processing device 802 may be configured to execute instructions implementing method 700 illustrated in FIG. 7.

Example computing device 800 may further comprise a network interface device 808, which may be communicatively coupled to a network 820. Example computing device 800 may further comprise a video display 810 (e.g., a liquid crystal display (LCD), a touch screen, or a cathode ray tube (CRT)), an alphanumeric input device 812 (e.g., a keyboard), a cursor control device 814 (e.g., a mouse), and an acoustic signal generation device 816 (e.g., a speaker).

Data storage device 818 may include a machine-readable storage medium (or, more specifically, a non-transitory machine-readable storage medium) 828 on which is stored one or more sets of executable instructions 822. For example the data storage may be physical storage on-premise or remote such as a cloud storage environment. In accordance with one or more aspects of the present disclosure, executable instructions 822 may comprise executable instructions associated with executing method 700 of FIG. 7. In one embodiment, instructions 822 include instructions for cooling module 129 of FIG. 1.

Executable instructions 822 may also reside, completely or at least partially, within main memory 804 and/or within processing device 802 during execution thereof by example computing device 800, main memory 804 and processing device 802 also constituting computer-readable storage media. Executable instructions 822 may further be transmitted or received over a network via network interface device 808.

While the computer-readable storage medium 828 is shown in FIG. 8 as a single medium, the term "computer-readable storage medium" should be taken to include a single medium or multiple media (e.g., a centralized or distributed database, and/or associated caches and servers) that store the one or more sets of operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "providing," "determining," "storing," "adjusting," "causing," "receiving," "comparing," "creating," "stopping," "loading," "copying," "throwing," "replacing," "performing," "inputting," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus may be specially constructed for the purposes, or it may be a general purpose computer system selectively programmed by a computer program stored in the computer system. Such a computer program may be stored in a computer readable storage medium, such as, but not limited to, any type of disk including optical disks, compact disc read only memory (CD-ROMs), and magnetic-optical disks, read-only memories (ROMs), random access memories (RAMs), erasable programmable read-only memory (EPROMs), electrically erasable programmable read-only memory (EEPROMs), magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems may be used with programs in accordance with the teachings herein, or it may prove convenient to construct a more specialized apparatus to perform the method operations. The structure for a variety of these systems will appear as set forth in the description below. In addition, the scope of the present disclosure is not limited to any particular programming language. It will be appreciated that a variety of programming languages may be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but may be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method, comprising:
receiving first data indicative of a process recipe for processing a substrate in a processing chamber of a substrate processing system;
inputting the first data into a model, wherein the model comprises a digital twin configured to represent thermal characteristics of the processing chamber;
receiving, via the model, a predicted value of a parameter associated with a flow of coolant through a cooling loop of the processing chamber; and
during execution of the process recipe in the processing chamber, causing coolant to flow through the cooling loop based on the predicted value of the parameter.

2. The method of claim 1, wherein the parameter comprises one of a flow rate of coolant through the cooling loop or an inlet temperature of coolant flowing through the cooling loop at an inlet of the cooling loop.

3. The method of claim 1, wherein the predicted value of the parameter comprises a predicted flow rate of coolant through the cooling loop, the method further comprising:
causing an actuator associated with the cooling loop to actuate according to the predicted flow rate to cause coolant to flow through the cooling loop substantially at the predicted flow rate.

4. The method of claim 1, further comprising:
determining a target coolant output temperature based on the predicted value of the parameter, wherein the coolant is caused to flow through the cooling loop to substantially maintain the coolant output from the cooling loop at the target coolant output temperature.

5. The method of claim 1, wherein the model comprises at least one of a physics-based model or a trained machine learning model.

6. The method of claim 1, wherein the model comprises a trained machine learning model, the method further comprising:
training a machine learning model to produce the trained machine learning model, wherein the machine learning model is trained with training input data comprising historical process recipe data and training target output data comprising historical parameter values associated with the flow of the coolant through the cooling loop of the processing chamber.

7. The method of claim 1, further comprising:
receiving second data indicative of one or more process conditions associated with processing the substrate in the processing chamber according to the process recipe; and
inputting the second data into the model, wherein the predicted value of the parameter is based on the first data and the second data.

8. The method of claim 7, wherein the one or more process conditions comprise:
a first coolant temperature measured by a first temperature sensor at an inlet of the first cooling loop; and
a second coolant temperature measured by a second temperature sensor at an outlet of the first cooling loop.

9. The method of claim 7, further comprising:
determining a fault condition of the processing chamber based on predicted conditions output from the model and further based on the second data.

10. The method of claim 1, wherein the predicted value of the parameter comprises a predicted coolant input temperature of coolant input to the cooling loop, the method further comprising:
causing coolant introduced at an inlet of the cooling loop to have a temperature substantially matching the predicted coolant input temperature.

11. The method of claim 1, wherein the first data comprises one or more of a process temperature for processing the substrate inside the processing chamber or a process pressure for processing the substrate inside the processing chamber.

12. The method of claim 1, further comprising:
receiving user input associated with the parameter; and
causing coolant to flow through the cooling loop further based on the user input.

13. The method of claim 1, further comprising:
inputting, into the model, a threshold component temperature associated with a component of the processing chamber, wherein the predicted value of the parameter is based on the first data and the threshold component temperature.

14. A system, comprising:
a processing chamber configured to process a substrate, the processing chamber comprising a cooling loop configured to flow coolant to cool at least a portion of the processing chamber;
a processing device configured to:
receive first data indicative of a process recipe for processing the substrate in the processing chamber;
input the first data into a model, wherein the model comprises a digital twin configured to represent thermal characteristics of the processing chamber;
receive, via the model, a predicted value of a parameter associated with a flow of coolant through the cooling loop of the processing chamber; and
during execution of the process recipe in the processing chamber, cause coolant to flow through the cooling loop based on the predicted value of the parameter.

15. The system of claim 14, wherein the predicted value of the parameter comprises a predicted flow rate of coolant through the cooling loop, wherein the system further comprises an actuator configured to cause regulation of a flow rate of coolant through the cooling loop, and wherein the processing device is further configured to:
cause the actuator to actuate according to the predicted flow rate to cause coolant to flow through the cooling loop substantially at the predicted flow rate.

16. The system of claim 14, wherein the model comprises a trained machine learning model, wherein the processing device is further configured to:
train a machine learning model to produce the trained machine learning model, wherein the machine learning model is trained with training input data comprising historical process recipe data and training target output data comprising historical parameter values associated with the flow of the coolant through the cooling loop of the processing chamber.

17. The system of claim 14, further comprising a plurality of sensors configured to sense one or more process conditions associated with processing the substrate in the processing chamber according to the process recipe, wherein the processing device is further configured to:
receive, from the plurality of sensors, second data indicative of the one or more process conditions; and
input the second data into the model, wherein the predicted value of the parameter is based on the first data and the second data.

18. A non-transitory machine-readable storage medium comprising instructions that, when executed by a processing device, cause the processing device to:
receive first data indicative of a process recipe for processing a substrate in a processing chamber of a substrate processing system;
input the first data into a trained machine learning model;
receive, via the trained machine learning model, a predicted value of a parameter associated with a flow of coolant through a cooling loop of the processing chamber; and
during execution of the process recipe in the processing chamber, cause coolant to flow through the cooling loop based on the predicted value of the parameter.

19. The non-transitory machine-readable storage medium of claim 18, wherein the trained machine learning model is trained with training input data comprising one or more of historical process recipe data, historical process condition data, or historical threshold chamber component temperature, wherein the training input data is labeled with corresponding target output data comprising historical parameter values associated with the flow of the coolant through the cooling loop of the processing chamber.

20. The non-transitory machine-readable storage medium of claim 18, wherein the predicted value of the parameter comprises a predicted flow rate of coolant through the cooling loop, and wherein the processing device is further to:

cause an actuator associated with the cooling loop to actuate according to the predicted flow rate to cause coolant to flow through the cooling loop substantially at the predicted flow rate.

* * * * *